(12) United States Patent
Sota

(10) Patent No.: US 9,116,683 B2
(45) Date of Patent: Aug. 25, 2015

(54) CONTROL DEVICE, CONTROL METHOD, AND SYSTEM

(71) Applicant: FUJITSU LIMITED, Kawasaki-shi, Kanagawa (JP)

(72) Inventor: Akihisa Sota, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 175 days.

(21) Appl. No.: 13/946,331

(22) Filed: Jul. 19, 2013

(65) Prior Publication Data

US 2014/0040651 A1    Feb. 6, 2014

(30) Foreign Application Priority Data

Aug. 1, 2012   (JP) .................................. 2012-170851

(51) Int. Cl.
| G06F 11/00 | (2006.01) |
| G06F 1/30 | (2006.01) |
| G06F 11/07 | (2006.01) |
| G11C 5/14 | (2006.01) |

(52) U.S. Cl.
CPC .............. *G06F 1/30* (2013.01); *G06F 11/0754* (2013.01); *G11C 5/144* (2013.01)

(58) Field of Classification Search
CPC .................................. G06F 1/30; G11C 5/144
USPC ....................................................... 714/22, 23
See application file for complete search history.

(56) References Cited

U.S. PATENT DOCUMENTS 6,687,627 B1* 2/2004 Gunn et al. ...................... 702/61
2004/0222389 A1* 11/2004 Swenson .................. 250/492.21

FOREIGN PATENT DOCUMENTS

| JP | 2006-33997 | 2/2006 |
| JP | 2008-148495 | 6/2008 |

* cited by examiner

*Primary Examiner* — Dieu-Minh Le
(74) *Attorney, Agent, or Firm* — Staas & Halsey LLP

(57) ABSTRACT

A control device, mounted removably on a substrate, includes a power outage detection unit that detects disconnection of electrical connection of a signal line that is wired to a power supply device on the substrate and detects a power outage state of the power supply device, and an output unit that outputs a power outage signal to a control target device on the substrate that executes predetermined power outage process, in a case that disconnection of the electrical connection of the signal line is detected by the power outage detection unit, after a lapse of a fixed time from detection of disconnection of the electrical connection of the signal line.

7 Claims, 18 Drawing Sheets

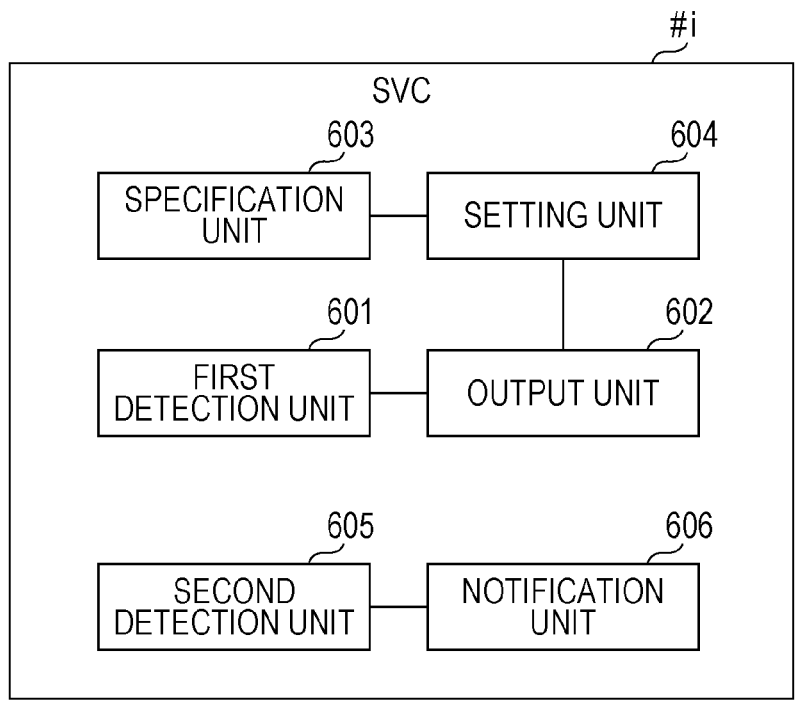
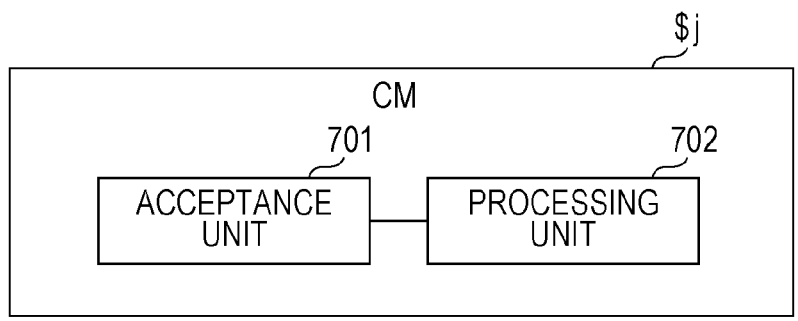

FIG. 18

VOLTAGE DROP TABLE ~1800

| CLOCK TIME | VOLTAGE | VOLTAGE DROP | |
|---|---|---|---|
| t1 | V1 | – | ~1800-1 |
| t2 | V2 | $\Delta V1$ | ~1800-2 |
| t3 | V3 | $\Delta V2$ | ~1800-3 |
| t4 | V4 | $\Delta V3$ | ~1800-4 |
| ⋮ | ⋮ | ⋮ | |

FIG. 19

DECISION TABLE ~1900

| NUMBER OF MOUNTED MODULES | $\Delta t$ | $\Delta V_{th}$ | |
|---|---|---|---|
| 2 | 20 ms | 1 V | ~1900-1 |
| 4 | 10 ms | 1 V | ~1900-2 |
| 8 | 5 ms | 1 V | ~1900-3 |

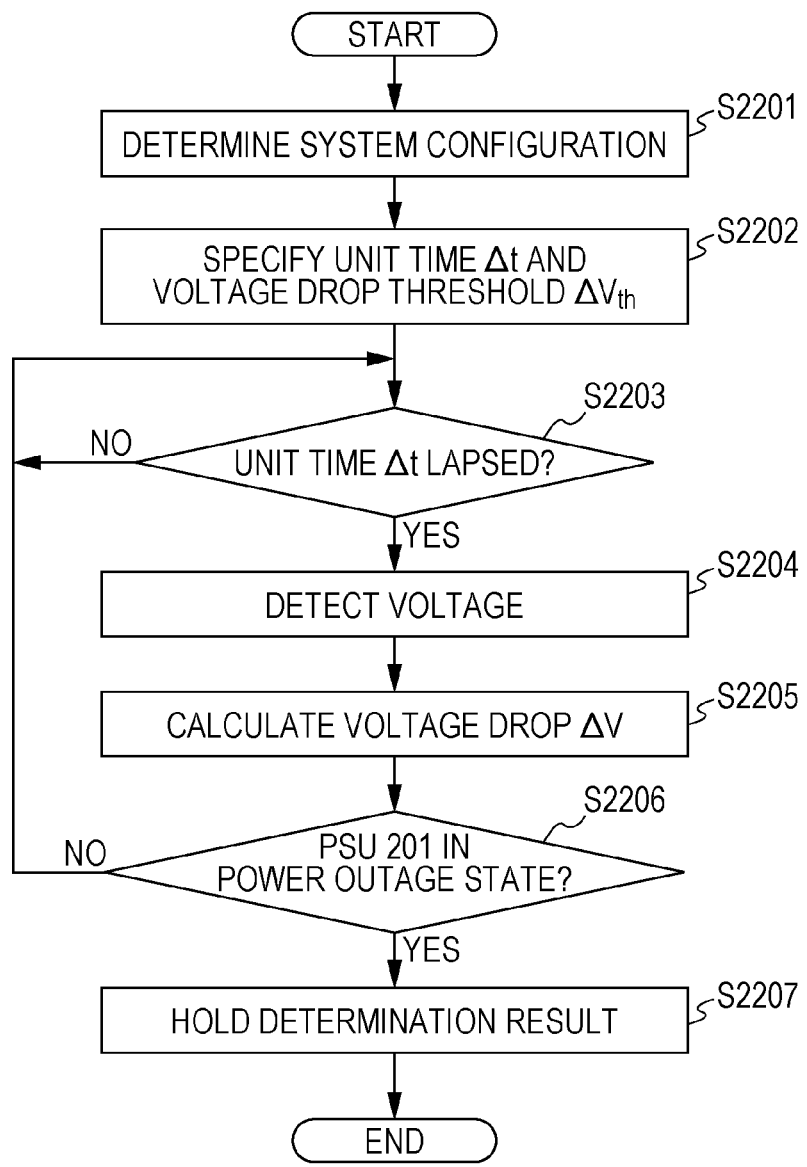

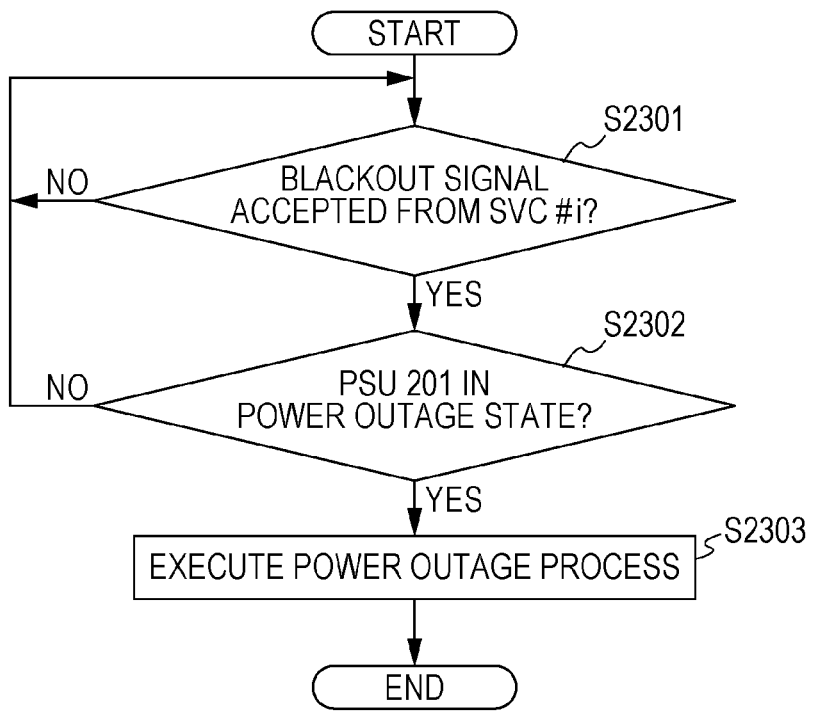

US 9,116,683 B2

CONTROL DEVICE, CONTROL METHOD, AND SYSTEM

CROSS-REFERENCE TO RELATED APPLICATION

This application is based upon and claims the benefit of priority of the prior Japanese Patent Application No. 2012-170851, filed on Aug. 1, 2012, the entire contents of which are incorporated herein by reference.

FIELD

The embodiments discussed herein are related to a control device, a control method, and a system.

BACKGROUND

In the past, there has been a control device that monitors a power outage state of a power supply device in a system and outputs a blackout signal at the time of power outage to cause a control target device to execute power outage process. Such a control device is mounted removably on a system substrate via a connector of the control device to allow removing for maintenance, inspection, and the like. Another device in the system determines whether or not the control device is removed by the presence of electrical connection of a signal line to recognize that the control device is mounted on the substrate.

As a related technique in the past, there is, for example, a technique that detects a voltage decrease of a commercial power supply, insulates the detection signal for incorporation, and obtains a switch output to a power supply in a battery switch circuit when the incorporated detection signal is applied and also a secondary output of an AC/DC convert starts decreasing. In addition, there is a technique that calculates a power outage detection value based on a load current value.

Japanese Laid-open Patent Publication No. 2006-33997 and Japanese Laid-open Patent Publication No. 2008-148495 are examples of the related art.

However, in the techniques in the past, when removing a control device for maintenance, inspection, and the like, there is a case of disconnecting electrical connection of a signal line for a control device to detect a power outage state of a power supply device before disconnecting electrical connection of a signal line for another device to recognize the control device. In this case, only by removing a control device for maintenance, inspection, and the like, power outage process sometimes turns out to be carried out by a control target device that has accepted a blackout signal from the control device.

It is desired to provide a control device, a control method, and a system that avoids execution of useless power outage process.

SUMMARY

According to an aspect of the invention, a control device mounted removably on a substrate, includes a power outage detection unit that detects disconnection of electrical connection of a signal line that is wired to a power supply device on the substrate and detects a power outage state of the power supply device, and an output unit that outputs a power outage signal to a control target device on the substrate that executes predetermined power outage process, in a case that disconnection of the electrical connection of the signal line is detected by the power outage detection unit, after a lapse of a fixed time from detection of disconnection of the electrical connection of the signal line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a block diagram depicting a hardware configuration example of an SVC and the like;

FIG. 6 is a block diagram depicting a functional configuration example of an SVC #i according to the first embodiment;

FIG. 7 is a block diagram depicting a functional configuration example of a CM $j according to the first embodiment;

FIG. 18 is an illustration depicting an example of memory contents of a voltage drop table;

FIG. 19 is an illustration depicting an example of memory contents of a decision table;

FIG. 22 is a flowchart representing an example of a determination process procedure of the CM $j according to the third embodiment; and FIG. 23 is a flowchart representing an example of a power outage process procedure of the CM $j according to the third embodiment.

DESCRIPTION OF EMBODIMENTS

With reference to the attached drawings, detailed descriptions are given below to embodiments of a control device, a control method, and a system according to the present disclosure.

(First Embodiment)

Figure 1:
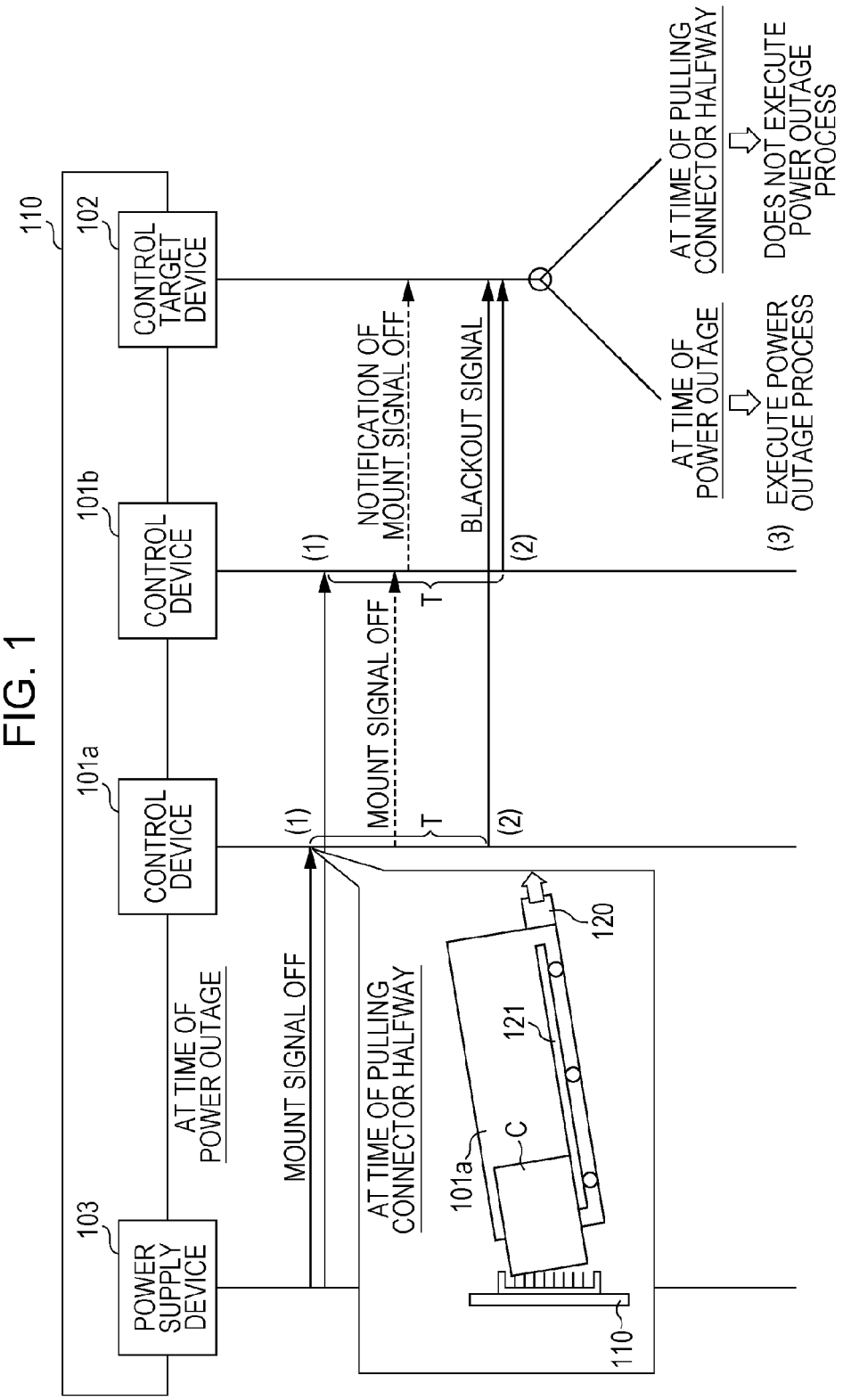
FIG. 1 is an illustration depicting an example of implementing a control method according to a first embodiment.

FIG. 1 is an illustration depicting an example of implementing a control method according to a first embodiment. In FIG. 1, a control device 101 is a computer that detects a power outage state of a power supply device 103 and outputs a blackout signal to a control target device 102. A blackout signal is a power outage signal representing that the power supply device 103 is in a power outage state.

The control target device 102 is a computer including a power outage processing device that executes predetermined power outage process. Specifically, for example, the control target device 102 is a controller that controls reading/writing of data to a disk. The predetermined power outage process is, for example, backup process of data that is memorized in a cache of the control target device 102 and the like.

The power supply device 103 is a computer that supplies the power to the control device 101 and the control target device 102. Specifically, for example, the power supply device 103 converts an alternating current (AC) power supply that is inputted from a commercial power supply to a direct current (DC) power supply to supply the DC power to the control device 101 and the control target device 102.

The control device 101, the control target device 102, and the power supply device 103 are mounted on a substrate 110 that is subjected to wiring for connection between the devices. The control device 101 is removably mounted on the substrate 110 via a connector C of the control device 101. In addition, for example, to add redundancy, a plurality of control devices 101 are mounted on the substrate 110 (in FIG. 1, control devices 101a and 101b).

Here, the control devices 101a and 101b are wired to the power supply device 103 by a signal line that detects power outage state of the power supply device 103. The control devices 101a and 101b determine that the power supply device 103 is in a power outage state when electrical connection of the signal line that detects a power outage state of the power supply device 103 is disconnected (so-called high impedance).

The control device 101a is wired to the control device 101b by a signal line to recognize the control device 101b on the substrate 110. The control device 101a determines that the control device 101b is removed from the substrate 110 when electrical connection of the signal line to recognize the control device 101b is disconnected.

Similarly, the control device 101b is wired to the control device 101a by a signal line to recognize the control device 101a on the substrate 110. The control device 101b determines that the control device 101a is removed from the substrate 110 when electrical connection of the signal line to recognize the control device 101a is disconnected.

In addition, for example, in a case that the control device 101a is removed, the control device 101b notifies the control target device 102 that the control device 101a is not recognized. This enables the control target device 102 to determine that the control device 101a is removed from the substrate 110. In a case that the signal line to recognize the control device 101a is wired to the control target device 102, the control target device 102 is capable of determining that the control device 101a is removed from the substrate 110 when electrical connection of the signal line to recognize the control device 101a is disconnected.

Here, for maintenance, inspection, and the like, the control device 101 that is mounted on the substrate 110 is sometimes removed. For example, a worker, such as, a customer engineer (CE) is capable of removing the control device 101 from the substrate 110 by pulling out an ejector 120 of the control device 101.

At this time, a force is sometimes applied in such a manner that a lower side (in FIG. 1, a board 121) of the control device 101 is pulled first and thus a signal line (pin) that is assigned to the lower side of the connector C of the control device 101 is pulled prior to other signal lines.

More specifically, for example, when removing the control device 101a, there is a case that the electrical connection of the signal line for the control device 101a to detect a power outage state of the power supply device 103 is disconnected before the electrical connection of the signal line to recognize the control device 101a is disconnected. As a result, a blackout signal is outputted from the control device 101a and the control target device 102 sometimes turns out to execute power outage process before determining that the control device 101a is removed.

In the descriptions below, there is a case that the signal line that detects a power outage state of the power supply device 103 is expressed as "a mount signal of the power supply device 103" and a signal line for another device (for example, the control device 101b) to recognize the control device 101a is expressed as "a mount signal of the control device 101a". In addition, there is a case that, when removing the control device 101, a state of disconnecting the electrical connection of the signal line that detects a power outage state of the power supply device 103 before the electrical connection of the signal line to recognize the control device 101 is disconnected is expressed as "a connector pulled halfway".

With that, in order to avoid that, when removing the control device 101a, the mount signal of the power supply device 103 is pulled prior to the mount signal of the control device 101a, it is considered to shorten a pin length of the mount signal of the control device 101a than a pin length of the mount signal of the power supply device 103. However, since a pin length of the connector C has to be adjusted, it turns out to result in an increase in costs of the connector C.

In addition, in order to avoid that, when removing the control device 101a, the mount signal of the power supply device 103 is pulled prior to the mount signal of the control device 101a, it is considered to provide mount signals of the control device 101a at the four (diagonal) corners of the connector C. However, due to limitation of the number of signals provided in the connector C and the like, there is a case that it is not possible to provide the mount signals of the control device 101a at the four (diagonal) corners.

With that, in the first embodiment, the control device 101 outputs a blackout signal to the control target device 102 after a lapse of a fixed time T from the disconnection of the electrical connection of the mount signal of the power supply device 103. This avoids accepting a blackout signal before the control device 101 is unmounted, that is, before the control target device 102 determines that the control device 101 is removed, and thus avoids power outage process when a connector of the control device 101 is pulled halfway. Descriptions are given below to an example of implementing a control method according to the first embodiment.

(1) The control device 101 detects disconnection of electrical connection of a signal line that is wired to the power supply device 103 on the substrate 110 and detects a power outage state of the power supply device 103 (the mount signal of the power supply device 103). Here, the electrical connection of the signal line that detects a power outage state of the power supply device 103 is disconnected at the time of, for example, "power outage" and "pulling a connector halfway".

For example, in a case that the power supply device 103 is actually in a power outage state, the control devices 101a and 101b detect disconnection of the electrical connection of the signal line that detects a power outage state of the power supply device 103. In contrast, in a case that the control device 101a turns into a state of pulling a connector halfway when removing the control device 101a, the control device 101a detects disconnection of the electrical connection of the signal line that detects a power outage state of the power supply device 103 (the mount signal of the power supply device 103).

(2) In a case that disconnection of the electrical connection of the signal line that detects a power outage state of the power supply device 103 is detected, the control device 101 outputs a blackout signal to the control target device 102 on the substrate 110 after a lapse of a fixed time T from the detection of the disconnection of the electrical connection of the signal line.

That is, when a connector of the control device 101 is pulled halfway, in order to avoid that the control target device 102 accepts a blackout signal from the control device 101 before determining that the control device 101 is removed, an output timing of a blackout signal is delayed.

Here, a case that a period of continuing the state of pulling a connector of the control device 101 halfway is less than 50 ms is assumed. In this case, by delaying an output timing of a blackout signal for 50 ms or more, it is enabled to avoid accepting a blackout signal from the control device 101 before the control target device 102 determines that the control device 101 is removed.

On the other hand, when an output timing of a blackout signal is delayed for a long period of time at the time of actual power outage, there is a case that, for example, a battery power supply is outputted at a delayed timing and the output voltage falls below the minimum operating voltage of the control device 101 or the control target device 102 to cause defects. Therefore, the fixed time T is set considering the length of the period of time of the control device 101 in a state of pulling a connector halfway and the load applied to the power supply device 103. A specific setting example of the fixed time T ("a set time T" described later) is described later.

(3) In a case of accepting a blackout signal from the control device 101, the control target device 102 executes predetermined power outage process. At this time, the control target device 102 does not execute the power outage process even when accepting a blackout signal from the control device 101 which the control target device 102 determines to be removed from the substrate 110.

For example, in a case of being notified of not recognizing the control device 101a from the control device 101b, the control target device 102 does not execute the power outage process even when accepting a blackout signal from the control device 101a. In addition, in a case that the electrical connection of the signal line to recognize the control device 101a is disconnected before accepting a blackout signal from the control device 101a, the control target device 102 does not execute the power outage process even when accepting a blackout signal from the control device 101a.

As just described, according to the control device 101, it is enabled to output a blackout signal to the control target device 102 after a lapse of the fixed time T in a case of detecting disconnection of the electrical connection of the signal line that detects a power outage state of the power supply device 103. This enables to delay a timing of outputting a blackout signal to the control target device 102 for the fixed time T at the time of power outage or pulling a connector halfway.

As a result, when a connector of the control device 101 is pulled halfway for maintenance, inspection, and the like, it is possible to avoid defects of accepting a blackout signal before the control target device 102 recognizes that the control device 101 is removed and avoid useless power outage process of the control target device 102.

(System Configuration Example of Storage System)

Figure 2:
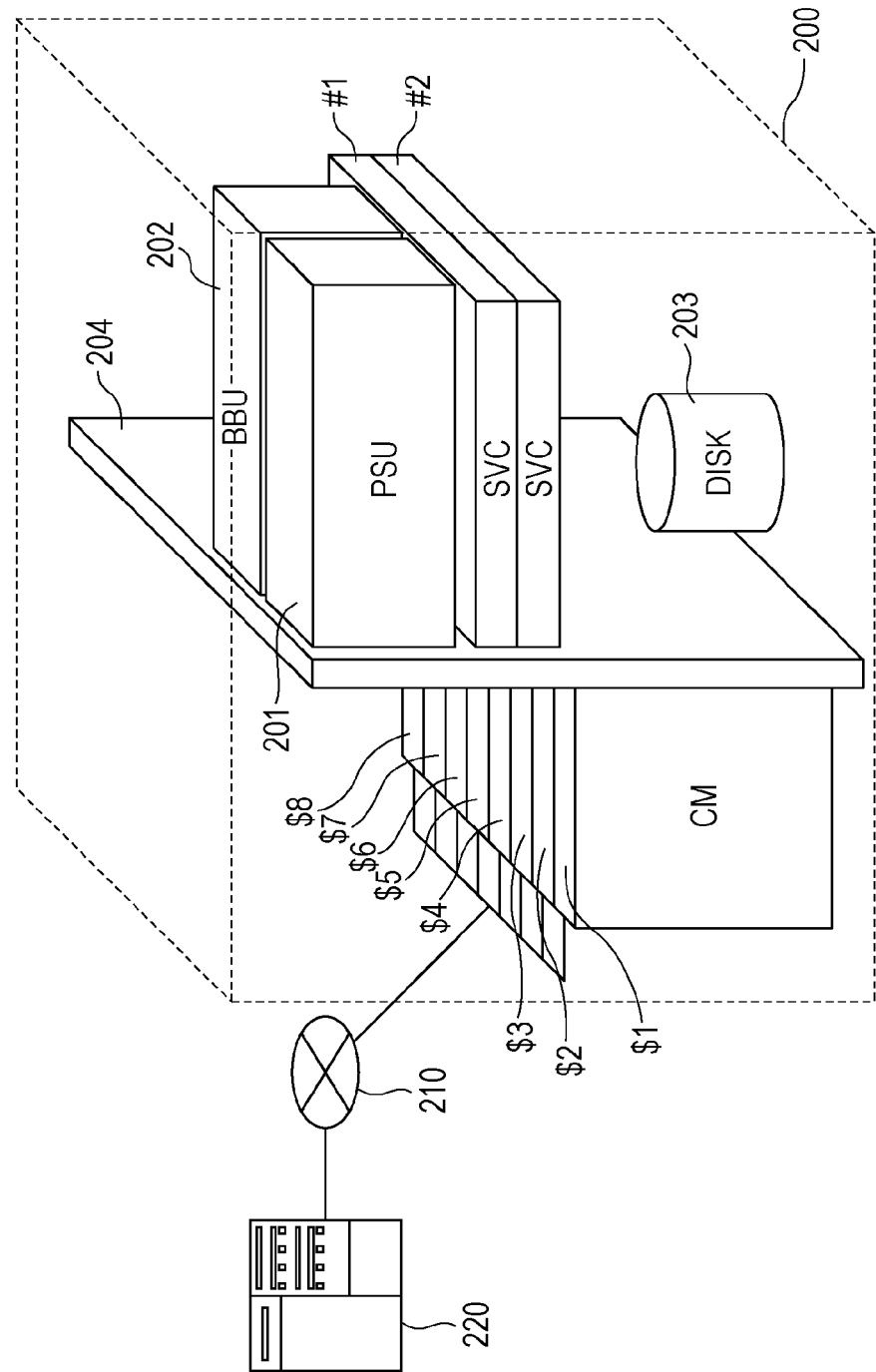
FIG. 2 is an illustration depicting a system configuration example of a storage system.

Next, descriptions are given to a system configuration example of a storage system 200 according to the first embodiment. FIG. 2 is an illustration depicting a system configuration example of a storage system 200. In FIG. 2, the storage system 200 includes service controllers (SVC) #1 and #2, controller modules (CM) $1 through $8, a power supply unit (PSU) 201, a battery backup unit (BBU) 202, a disk 203, and a mid plane (MP) 204.

Here, the storage system 200 is connected to a host device 220 via a wired or wireless network 210. The network 210 is, for example, the Internet, a local area network (LAN), a wide area network (WAN), or the like.

The SVCs #1 and #2 are computers that monitor the storage system 200. The plurality of SVCs are mounted on the storage system 200 to add redundancy, for example (in the example of FIG. 2, two SVCs #1 and #2). The SVCs #1 and #2 are equivalent to the control device 101 illustrated in FIG. 1.

The CMs $1 through $8 are computers that control reading/writing of data. The plurality of CMs are mounted on the storage system 200 to improve performance and add redundancy, for example (in the example of FIG. 2, eight CMs $1 through $8). The CMs $1 through $8 are equivalent to the control target device 102 illustrated in FIG. 1.

The PSU 201 is a power supply device that supplies electrical power to the storage system 200. The PSU 201 converts, for example, an AC power that is supplied from a commercial power supply (or client power supply facilities) to a DC power to supply the SVCs #1 and #2, the CMs $1 through $8, and the BBU 202. The PSU 201 is equivalent to the power supply device 103 illustrated in FIG. 1.

In a case that the supply of electrical power from the PSU 201 to the storage system 200 is stopped by some sort of factors, such as power outage, the BBU 202 supplies power from a built-in battery to the storage system 200. The BBU 202 is equivalent to the control target device 102 illustrated in FIG. 1. The disk 203 is a memory device to memorize data that is written by control of the CMs $1 through $8 and to cause the CMs $1 through $8 to read the data that is memorized in the disk 203.

The MP 204 is a substrate on which the SVCs #1 and #2, the CMs $1 through $8, the PSU 201, the BBU 202, and the disk 203 are mounted. The MP 204 forms a bus by interconnecting a plurality of connectors on the substrate. Inserting the SVCs #1 and #2, the CMs $1 through $8, the PSU 201, the BBU 202, and the disk 203 into the connectors of the MP 204 enables interconnection. The MP 204 is equivalent to the substrate 110 illustrated in FIG. 1.

The host device 220 is a computer that accesses the storage system 200. The CMs $1 through $8 control reading/writing of data in accordance with an access request from the host device 220. The host device 220 is, for example, a server, a personal computer (PC), or the like.

(Behavior Example of Storage System 200)

Figure 3:
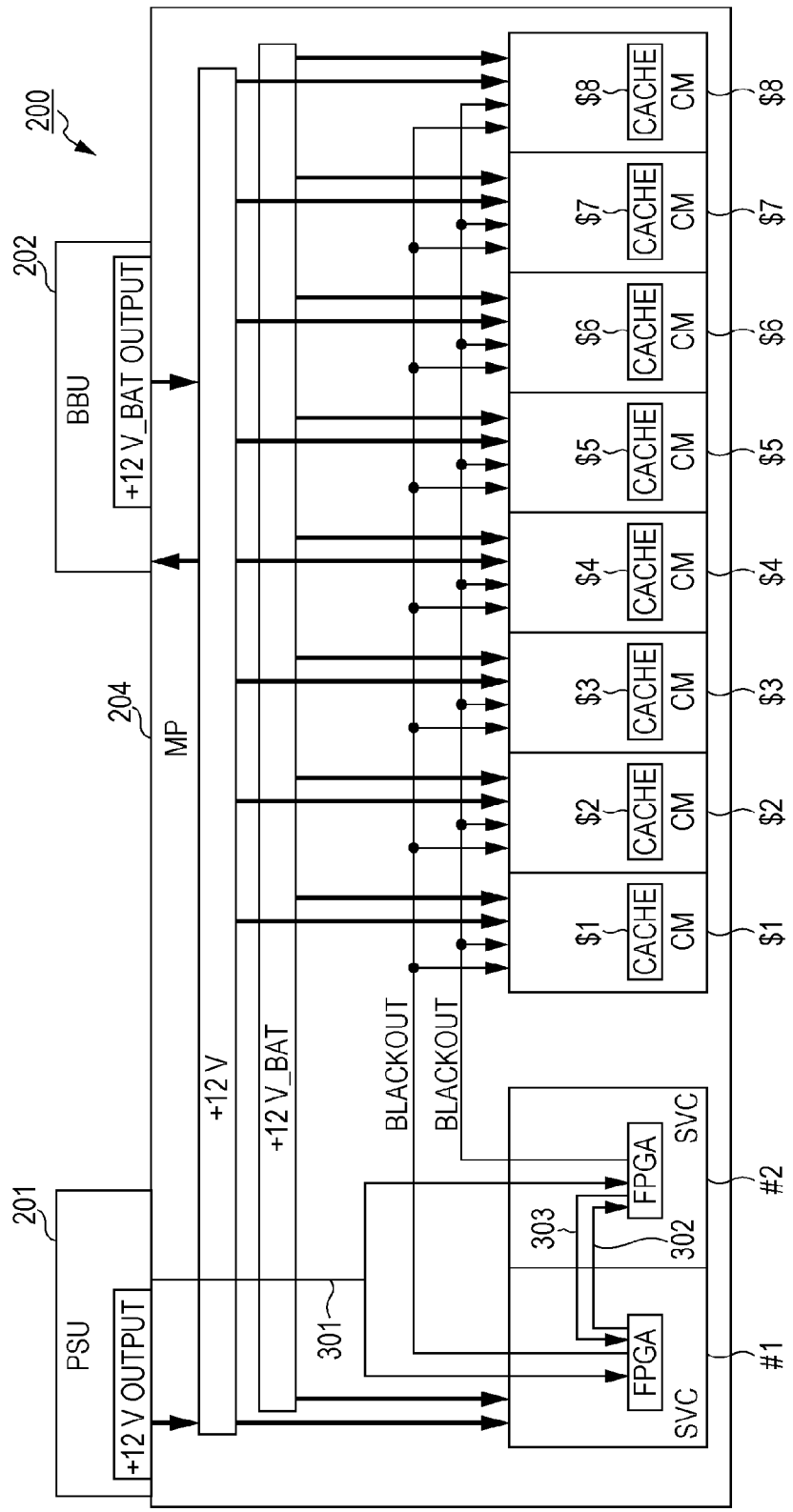
FIG. 3 is an illustration depicting a behavior example of the storage system.

FIG. 3 is an illustration depicting a behavior example of the storage system 200. In FIG. 3, the PSU 201 outputs a power supply (DC power) of +12 V in a state of having an AC power supplied thereto from a commercial power supply. The power supply of +12 V is supplied to the SVCs #1 and #2 and the CMs $1 through $8 and also supplied to the BBU 202 for battery charging. The PSU 201 turns into a power outage state when supply of the AC power from the commercial power supply is stopped.

The PSU 201 has a mount signal line 301 that represents a low active mount signal. The signal line 301 is wired to the SVCs #1 and #2. The SVCs #1 and #2 detect a power outage state of the PSU 201 by the presence of electrical connection of the signal line 301. Since the PSU 201 puts a mount signal into high impedance in a power outage state, the signal line 301 is connected to a pull-up resistor in the SVCs #1 and #2.

Since the PSU 201 becomes not capable of outputting the power supply of +12 V when becoming in a power outage state, electrical power is supplied from the BBU 202 to the SVCs #1 and #2 and the CMs $1 through $8. Specifically, for example, when the mount signal of the PSU 201 becomes high from low and the SVCs #1 and #2 are determined to be in a power outage state, a blackout signal is outputted from the SVCs #1 and #2 to the CMs $1 through $8 and the BBU 202.

When becoming in a power outage state, the CMs $1 through $8 and the BBU 202 execute predetermined power outage process. Specifically, for example, the CMs $1 through $8 cancel exchange of data with the host device 220 to carry out backup of data that is memorized in caches $1 through $8 or to output an alarm. The BBU 202 outputs a power supply of +12 V_BAT.

The SVC #1 has a mount signal line 302 that represents a mount signal. The mount signal line 302 is wired to the SVC #2. The SVC #2 recognizes the SVC #1 by the presence of electrical connection of the mount signal line 302. The SVC #2 has a mount signal line 303 that represents a mount signal. The mount signal line 303 is wired to the SVC #1. The SVC #1 recognizes the SVC #2 by the presence of electrical connection of the mount signal line 303.

In a case that charging of the BBU 202 is not sufficient, the CMs $1 through $8 become not capable of carrying out backup of the data that is memorized in the caches $1 through $8 at the time of power outage, so that the mode of operation becomes a write-through mode from a write-back mode.

In the descriptions below, there is a case of expressing the plurality of SVCs that are mounted in the storage system 200 as "SVCs #1 through #n" (in the example of FIG. 2, n=2) and expressing an arbitrary SVC among the SVCs #1 through #n as "an SVC #i" (i=1, 2, . . . , n). In addition, there is a case of expressing the plurality of CMs that are mounted in the storage system 200 as "CMs $1 through $m" (in the example of FIG. 2, m=8) and expressing an arbitrary CM among the CMs $1 through $m as "a CM $j" (j=1, 2, . . . , m).

(Hardware Configuration Example of SVC #i and CM $j)

Next, descriptions are given to a hardware configuration example of an SVC #i and a CM $j (here, they are expressed simply as "an SVC and the like").

Figure 4:
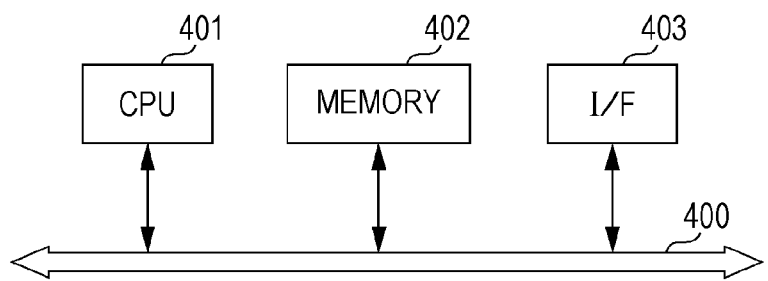

FIG. 4 is a block diagram depicting a hardware configuration example of an SVC and the like. In FIG. 4, the SVC and the like have a central processing unit (CPU) 401, a memory 402, and an interface (I/F) 403. Each component is connected respectively by a bus 400.

Here, the CPU 401 is in charge of control over the entire SVC and the like. The memory 402 has, for example, a read only memory (ROM), a random access memory (RAM), a flash ROM, and the like.

More specifically, for example, the flash ROM memorizes a program, such as an OS and a firmware, the ROM memorizes an application program, and the RAM is used as a work area for the CPU 401. The program that is memorized in the memory 402 is loaded into the CPU 401, thereby turning out to cause the CPU 401 to execute the coded process. For example, the caches $1 through $8 of the CMs $1 through $8 illustrated in FIG. 3 are achieved by the memory 402.

The I/F 403 controls input/output of data from an external device. Specifically, for example, the I/F 403 of the CMs $1 through $8 is connected to the network 210 through a communication line and is connected to an external device (for example, the host device 220 illustrated in FIG. 2) via the network 210. Then, the I/F 403 is in charge of an interface between the network 210 and inside and controls input/output of data from the external device. It is possible to employ, for example, a modem or a LAN adaptor for the I/F 403.

(Memory Contents of BBU Output Starting Time Table 500)

Next, descriptions are given to memory contents of a BBU output starting time table 500 that is used by an SVC #i. The BBU output starting time table 500 is memorized in, for example, the memory 402 of an SVC #i that is illustrated in FIG. 4.

Figure 5:
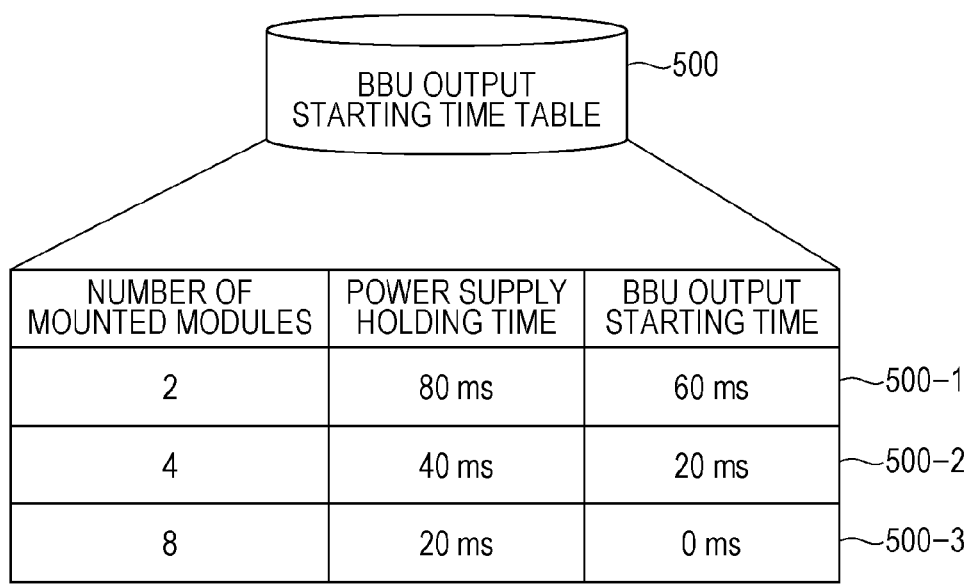
FIG. 5 is an illustration depicting an example of memory contents of a BBU output starting time table.

FIG. 5 is an illustration depicting an example of memory contents of a BBU output starting time table 500. In FIG. 5, the BBU output starting time table 500 has fields of a number of mounted modules, a power supply holding time, and a BBU output starting time. By setting information for each field, BBU output starting time information 500-1 through 500-3 is memorized as a record.

Here, the number of mounted modules indicates a number of CMs $j that are mounted in the storage system 200. The power supply holding time is a power supply holding time of the PSU 201 at the time of power outage. The BBU output starting time indicates a delay time before the BBU 202 starts output of a power supply of +12 V_BAT at the time of power outage.

For example, the BBU output starting time information 500-1 indicates a power supply holding time "80 ms" and a BBU output starting time "60 ms" in a case that the number of CMs $j that are mounted in the storage system 200 is two.

(Functional Configuration Example of SVC #i)

FIG. 6 is a block diagram depicting a functional configuration example of an SVC #i according to the first embodiment. In FIG. 6, the SVC #i has a configuration that includes a first detection unit 601, an output unit 602, a specification unit 603, a setting unit 604, a second detection unit 605, and a notification unit 606. The respective functional units achieve their functions specifically by, for example, causing the CPU 401 to execute a program that is memorized in the memory 402 illustrated in FIG. 4 or by the I/F 403. In addition, a process result of each functional unit is memorized in, for example, the memory 402.

The first detection unit 601 has a function of detecting disconnection of electrical connection of a first signal line. Here, the first signal line is a signal line that is wired to the PSU 201 on the MP 204 for detection of a power outage state of the PSU 201, and is the mount signal line 301 illustrated in FIG. 3, for example.

Specifically, for example, the first detection unit 601 detects that a mount signal of the mount signal line 301 becomes high from low. By detecting that the mount signal of the PSU 201 becomes high from low, the SVC #i is capable of detecting that the PSU 201 turns into a power outage state.

In a case that disconnection of electrical connection of the first signal line is detected by the first detection unit 601, the output unit 602 has a function of outputting a blackout signal to a CM $j after a lapse of the set time T from the detection of the disconnection of the electrical connection of the first signal line. This enables to delay a timing of outputting a blackout signal to a CM $j for the set time T at the time of power outage or pulling a connector halfway.

In addition, in a case that disconnection of electrical connection of the first signal line is detected by the first detection unit 601, the output unit 602 may also output a blackout signal to the BBU 202 after a lapse of the set time T from the detection of the disconnection of the electrical connection of the first signal line. This enables to delay a timing of outputting a blackout signal to the BBU 202 for the set time T at the time of power outage or pulling a connector halfway.

The specification unit 603 has a function of specifying a delay time D corresponding to the number of CMs $j that are mounted on the MP 204. Here, the delay time D indicates a latency time from the disconnection of the electrical connection of the first signal line (for example, the mount signal line 301) to output of a blackout signal.

In addition, the number of CMs $j that are mounted on the MP 204 may also be specified by, for example, at the time of starting up an SVC #i, the SVC #i communicating with the CMs $j that are mounted on the MP 204 and may also be preset and memorized in the memory 402.

Specifically, for example, the specification unit 603 specifies a BBU output starting time that corresponds to the number of CMs $j on the MP 204 as the delay time D referring to the BBU output starting time table 500 illustrated in FIG. 5. For example, in a case that the number of CMs $j that are mounted on the MP 204 is two, the specification unit 603 specifies the BBU output starting time "60 ms" that corresponds to the number of CMs $j "2" as the delay time D referring to the BBU output starting time table 500.

The setting unit 604 has a function of setting the delay time D that is specified by the specification unit 603 as the set time T. Specifically, for example, in a case that the number of CMs $j that are mounted on the MP 204 is two, the setting unit 604 sets the delay time D "60 ms" as the set time T. This delay time D "60 ms" is a value, when it takes 20 ms to reach a minimum operating voltage of an SVC #i or a CM $j after the BBU 202 starts output, with a margin of 20 ms for the power supply holding time "80 ms" in a case that the number of CMs $j that are mounted on the MP 204 is two.

For example, in a case that the number of CMs $j that are mounted on the MP 204 is four, the setting unit 604 sets the delay time D "20 ms" as the set time T. This delay time D "20 ms" is a value, when it takes 20 ms to reach a minimum operating voltage of an SVC #i or a CM $j after the BBU 202 starts output, with a margin of 20 ms for a power supply holding time "40 ms" in a case that the number of CMs $j that are mounted on the MP 204 is four.

This enables to set the set time T before outputting a blackout signal in accordance with the number of CMs $j on the MP 204. Specifically, in a case that the number of CMs $j on the MP 204 is large and the load of the PSU 201 is high, the voltage of the PSU 201 rapidly decreases at the time of power outage compared with a case of a smaller number of CMs $j, so that it is enabled to shorten the set time T. In contrast, in a case that the number of CMs $j on the MP 204 is small and the load of the PSU 201 is low, the voltage of the PSU 201 gradually decreases at the time of power outage compared with a case of a larger number of CMs $j, so that it is enabled to lengthen the set time T.

When the period of continuing the state of pulling a connector of an SVC #i halfway is less than 20 ms, for example, the setting unit 604 may also set the delay time D "20 ms" as the set time T even in a case that the number of CMs $j that are mounted on the MP 204 is two. Since the maximum period of continuing the state of pulling a connector of an SVC #i halfway depends on the connector structure of the SVC #i and the like, it may be, for example, manually measured in advance and memorized in the memory 402.

The second detection unit 605 has a function of detecting disconnection of electrical connection of a second signal line. Here, the second signal line is a signal line that is wired to another SVC #k on the MP 204 and recognizes the SVC #k, and is the mount signal line 302 or 303 illustrated in FIG. 3, for example (k≠i, k=1, 2, . . . , n).

Specifically, when the SVC #2 is pulled out of the MP 204 for maintenance, inspection, and the like, for example, electrical connection of the mount signal line 303 is disconnected and the second detection unit 605 of the SVC #1 detects the disconnection of the electrical connection of the mount signal line 303.

The notification unit 606 has a function of notifying a CM $j that another SVC #k is not recognized in a case that disconnection of electrical connection of the second signal line is detected by the second detection unit 605. Specifically, in a case that electrical connection of the mount signal line 303 is disconnected, for example, the notification unit 606 of the SVC #1 notifies the CMs $1 through $8 of unmount notification representing that the SVC #2 is not recognized.

This enables, in the storage system 200, an SVC #i to notify a CM $j that an SVC #k is pulled out of the MP 204 and is not recognized even in a configuration that a mount signal of the SVC #k is not inputted directly to the CM $j.

The notification unit 606 may also notify the BBU 202 that another SVC #k is not recognized in a case that disconnection of electrical connection of the second signal line is detected by the second detection unit 605. Specifically, in a case that electrical connection of the mount signal line 303 is disconnected, for example, the notification unit 606 of the SVC #1 notifies the BBU 202 that the SVC #2 is not recognized.

This enables, in the storage system 200, an SVC #i to notify the BBU 202 that an SVC #k is pulled out of the MP 204 and is not recognized even in a configuration that a mount signal of the SVC #k is not inputted directly to the BBU 202.

(Functional Configuration Example of CM $j)

FIG. 7 is a block diagram depicting a functional configuration example of a CM $j according to the first embodiment. In FIG. 7, a CM $j has a configuration that includes an acceptance unit 701 and a processing unit 702. The respective functional units achieve their functions specifically by, for example, causing the CPU 401 to execute a program that is memorized in the memory 402 illustrated in FIG. 4 or by the I/F 403. In addition, a process result of each functional unit is memorized in, for example, the memory 402.

The acceptance unit 701 has a function of accepting a blackout signal from an SVC #i. The blackout signal is, as described above, a signal that is outputted from an SVC #i in a case that electrical connection of the first signal line to connect the PSU 201 on the MP 204 with the SVC #i is disconnected. This enables a CM $j to detect that the PSU 201 turns into a power outage state.

The acceptance unit 701 may also accept unmount notification representing that an SVC #k is not recognized from an SVC #i. This enables a CM $j to determine that an SVC #k is pulled out of the MP 204 and is not recognized even in a configuration that a mount signal of the SVC #k is not inputted directly to the CM $j.

The processing unit 702 has a function of executing predetermined power outage process in a case of accepting a blackout signal from an SVC #i that is recognized by the acceptance unit 701. Specifically, in a case of accepting a blackout signal from a recognized SVC #i, for example, the processing unit 702 cancels exchange of data with the host device 220 and carries out backup of data that is memorized in a cache $j.

That is, the processing unit 702 does not execute power outage process even when accepting a blackout signal from an SVC #k that is not recognized any more. It is capable of specifying an SVC #k that is not recognized any more by, for example, accepting unmount notification from an SVC #i that is recognized.

A CM $j may also determine whether or not accepting a blackout signal from all recognized SVCs #i. Then, a CM $j may also execute power outage process in a case of accepting a blackout signal from all recognized SVCs #i.

At this time, a CM $j may also determine whether or not it is possible to communicate with an SVC #k by attempting communication with an SVC #k that has not notified of a blackout signal. This enables to execute power outage process, even when not accepting a blackout signal from an SVC #k, in a case capable of determining as being in a state of not capable of communicating with the SVC #k due to a failure and the like.

To the BBU 202 as well, a functional configuration similar to the CM $j described above may also be applied. The processing unit 702 of the BBU 202, however, starts execution of power outage process that outputs a power supply of +12 V_BAT in a case of accepting a blackout signal from a recognized SVC #i.

In this case, the CM $j may also execute power outage process in a case that a blackout signal from an SVC #i is accepted and also a power supply of +12 V_BAT is inputted from the BBU 202. This enables the CM $j to execute power outage process in a case that the BBU 202 also determines that the PSU 201 turns into a power outage state.

In addition, the CM $j may also notify the BBU 202 that the PSU 201 turns into a power outage state in a case of accepting a blackout signal from a recognized SVC #i. In this case, the BBU 202 may also start execution of power outage process that outputs a power supply of +12 V_BAT in a case of being notified that the PSU 201 is in a power outage state from a CM $j.

In a case of causing any CM $j of the CMs $1 through $8, instead of the SVC #i, to monitor the storage system 200, the functional configuration of an SVC #i described above may also be applied to the CM $j that monitors the storage system 200.

(Power Outage Process Procedure of PSU 201)

Next, descriptions are given to a power outage process procedure of the PSU 201. Power outage process of the PSU 201 starts execution in a case that, for example, the power supply of the PSU 201 is activated.

Figure 8:
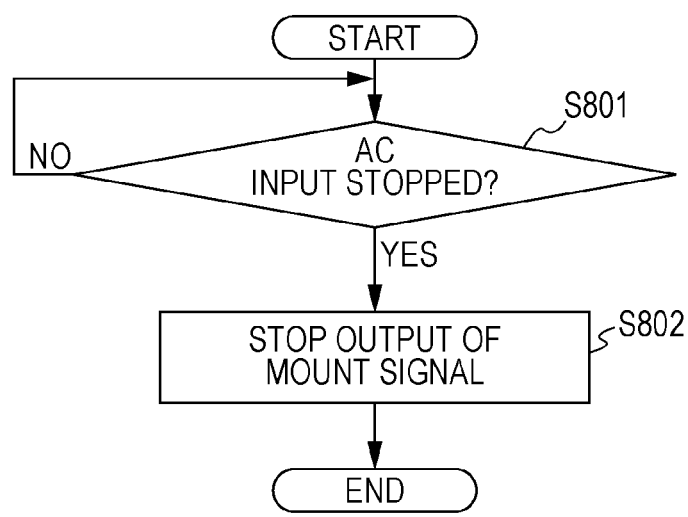
FIG. 8 is a flowchart representing an example of a power outage process procedure of a PSU.

FIG. 8 is a flowchart representing an example of a power outage process procedure of a PSU 201. In the flowchart of FIG. 8, the PSU 201 firstly determines whether or not an AC input that is supplied from a commercial power supply (or client power supply facilities) is stopped (operation S801). Here, the PSU 201 waits for a stop of the AC input (No in operation S801).

Then, in a case that the AC input is stopped (Yes in operation S801), the PSU 201 stops output of a mount signal of the PSU 201 to an SVC #i (operation S802) and terminates a series of process by the present flowchart. Specifically, for example, the PSU 201 makes a mount signal to be high impedance and disconnects electrical connection of the mount signal line 301.

This enables to notify an SVC #i that an AC input is stopped to be in a power outage state.

(Various Process Procedures of SVC #i)

Next, descriptions are given to various process procedures of an SVC #i according to the first embodiment. Various types of process of an SVC #i start execution in a case, for example, that a power supply of the SVC #i is activated, that is, a case that supply of electrical power from the PSU 201 to the SVC #i is started. Firstly, descriptions are given to a power outage process procedure of an SVC #i according to the first embodiment.

Figure 9:
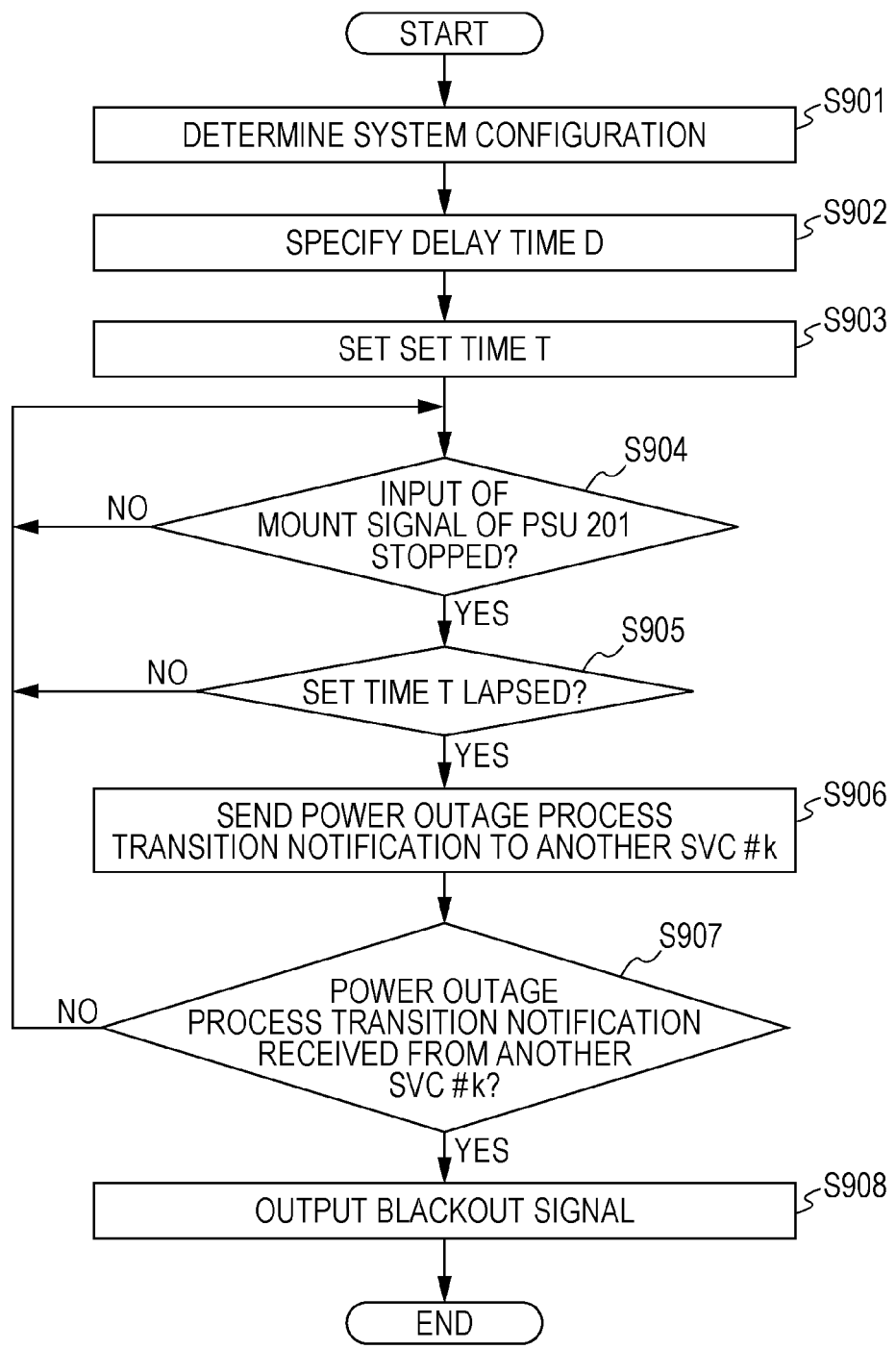
FIG. 9 is a flowchart representing an example of a power outage process procedure of the SVC #i according to the first embodiment.

FIG. 9 is a flowchart representing an example of a power outage process procedure of the SVC #i according to the first embodiment. In the flowchart of FIG. 9, an SVC #i firstly determines a system configuration of the storage system 200 (operation S901). Specifically, it is possible to determine the system configuration by, for example, an SVC #i communicating with another SVC #k, a CM $j, and the BBU 202 in the storage system 200.

Next, the SVC #i specifies the delay time D corresponding to the number of CMs $j on the MP 204 referring to the BBU output starting time table 500 (operation S902). Then, the SVC #i sets the specified delay time D as the set time T (operation S903).

Next, the SVC #i determines whether or not input of a mount signal of the PSU 201 is stopped (operation S904). Specifically, for example, the SVC #i determines whether or not electrical connection of the mount signal line 301 of the PSU 201 is disconnected.

Here, the SVC #i waits for stop of the input of a mount signal of the PSU 201 (No in operation S904). Then, in a case that the input of a mount signal of the PSU 201 is stopped (Yes in operation S904), the SVC #i determines whether or not the set time T has lapsed after stopping the input of a mount signal of the PSU 201 (operation S905).

Here, in a case that the set time T has not lapsed (No in operation S905), the SVC #i goes back to operation S904 to determine whether or not input of a mount signal of the PSU 201 is stopped. In contrast, in a case that the set time T has lapsed (Yes in operation S905), the SVC #i sends power outage process transition notification to the SVC #k (operation S906).

The power outage process transition notification notifies the SVC #k that power outage process is carried out as the PSU 201 is in a power outage state.

Next, the SVC #i determines whether or not power outage process transition notification is received from the SVC #k (operation S907). Here, in a case of not receiving power outage process transition notification (No in operation S907), the SVC #i goes back to operation S904 to determine whether or not input of a mount signal of the PSU 201 is stopped.

In contrast, in a case of receiving power outage process transition notification (Yes in operation S907), the SVC #i outputs a blackout signal to CMs $1 through $m and the BBU 202 (operation S908) and terminates a series of process by the present flowchart.

This enables to output a blackout signal to the CMs $1 through $m and the BBU 202 in a case that the PSU 201 turns into a power outage state.

Next, descriptions are given to an unmount notification process procedure that notifies a CM $j of unmount notification of another SVC #k. Unmount notification process of an SVC #i is executed, for example, in parallel with the power outage process of the SVC #i illustrated in FIG. 9.

Figure 10:
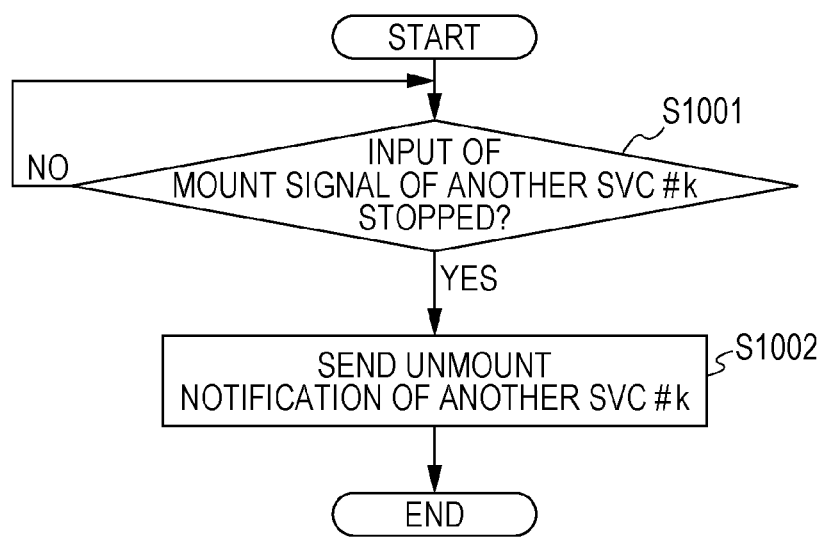
FIG. 10 is a flowchart representing an example of an unmount notification process procedure of the SVC #i.

FIG. 10 is a flowchart representing an example of an unmount notification process procedure of the SVC #i. In the flowchart of FIG. 10, the SVC #i firstly determines whether or not input of a mount signal of another SVC #k is stopped (operation S1001). Specifically, for example, the SVC #i determines whether or not electrical connection of a mount signal line (for example, the mount signal line 302 or 303) of another SVC #k is disconnected.

Here, the SVC #i waits for stop of input of a mount signal of another SVC #k (No in operation S1001). Then, in a case that input of a mount signal of the SVC #k is stopped (Yes in operation S1001), the SVC #i sends unmount notification of the SVC #k to CMs $1 through $m and the BBU 202 (operation S1002) and terminates a series of process by the present flowchart.

This enables to detect that the SVC #k is pulled out of the MP 204 for maintenance, inspection, and the like and notify the CMs $1 through $m and the BBU 202.

(Power Outage Process Procedure of CM $j)

Next, descriptions are given to a power outage process procedure of a CM $j according to the first embodiment. Power outage process of a CM $j starts execution in a case, for example, that a power supply of the CM $j is activated, that is, a case that supply of electrical power from the PSU 201 to the CM $j is started.

Figure 11:
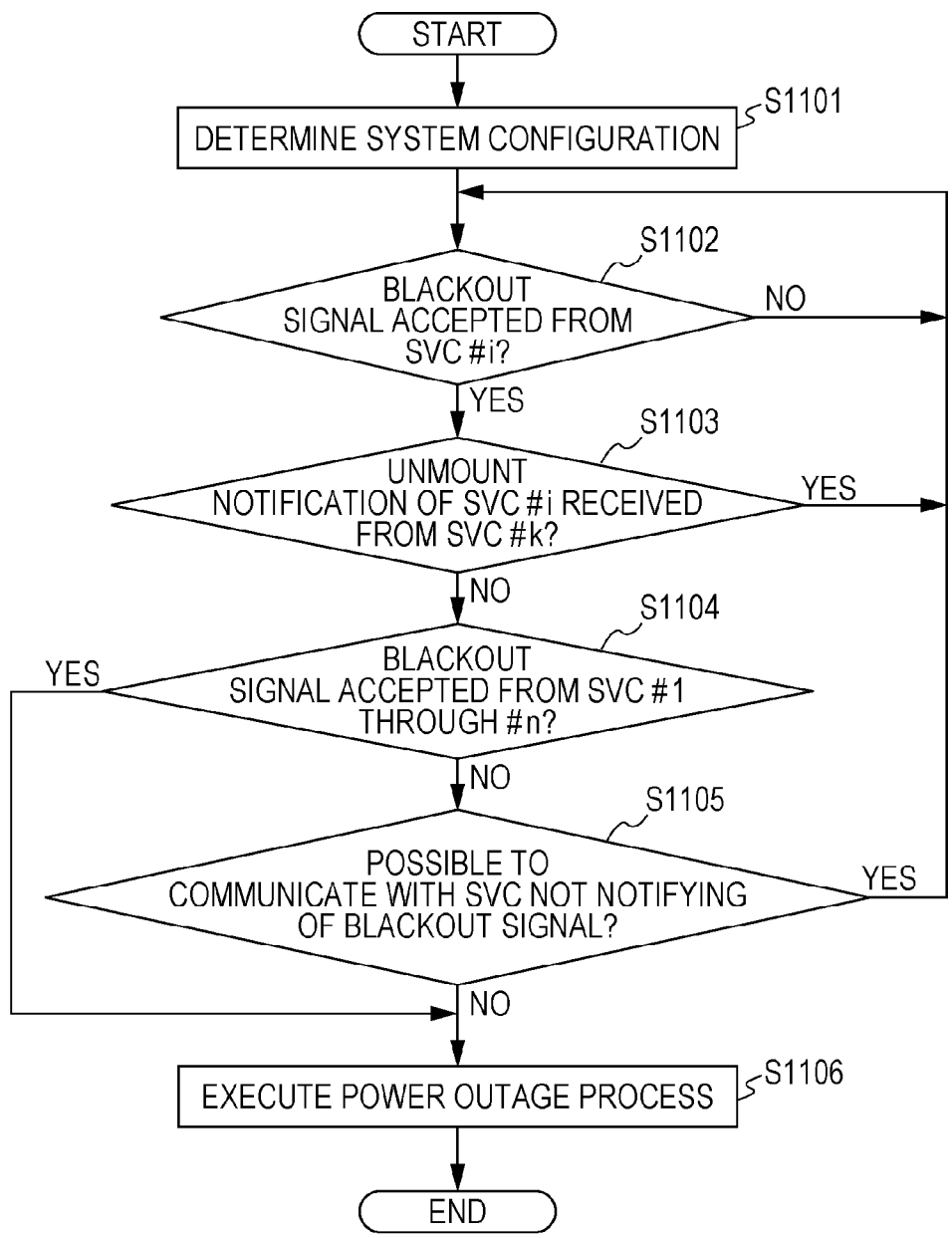
FIG. 11 is a flowchart representing an example of a power outage process procedure of the CM $j according to the first embodiment.

FIG. 11 is a flowchart representing an example of a power outage process procedure of the CM $j according to the first embodiment. In the flowchart of FIG. 11, a CM $j firstly determines a system configuration of the storage system 200 (operation S1101).

Next, the CM $j determines whether or not a blackout signal is accepted from an SVC #i (operation S1102). Here, the CM $j waits for a blackout signal to be accepted from the SVC #i (No in operation S1102).

Then, in a case of accepting a blackout signal from the SVC #i (Yes in operation S1102), the CM $j determines whether or not unmount notification of the SVC #i is received from another SVC #k (operation S1103). Here, in a case of receiving unmount notification of the SVC #i (Yes in operation S1103), the CM $j goes back to operation S1102.

In contrast, in a case of not receiving unmount notification of the SVC #i (No in operation S1103), the CM $j determines whether or not a blackout signal is accepted from all of SVCs #1 through #n in the storage system 200 (operation S1104). Here, in a case of accepting a blackout signal from all of the SVCs #1 through #n (Yes in operation S1104), the CM $j goes on to operation S1106.

In contrast, in a case of not accepting a blackout signal from all of the SVCs #1 through #n (No in operation S1104), the CM $j determines whether or not it is possible to communicate with an SVC that has not notified of a blackout signal (operation S1105). Here, in a case that it is possible to communicate with the SVC that has not notified of a blackout signal (Yes in operation S1105), the CM $j goes back to operation S1102.

In contrast, in a case of not capable of communicating with the SVC that has not notified of a blackout signal (No in operation S1105), the CM $j executes power outage process (operation S1106) and terminates a series of process by the present flowchart.

This enables to execute power outage process in a case of accepting a blackout signal from all of the SVCs #1 through #n except an SVC not capable of communicating due to a failure and the like. The CM $j, however, may also not execute the process in operations S1104 and S1105 to reduce the time before starting power outage process.

A power outage process procedure of the BBU 202 is similar to the power outage process procedure of the CM $j illustrated in FIG. 11, so that illustration and description thereof is omitted.

(Relationship Between Output Voltage of PSU 201 and Output Voltage of BBU 202)

Here, descriptions are given to relationship between an output voltage of the PSU 201 and an output voltage of the BBU 202 in the first embodiment. Firstly, relationship between an output voltage of the PSU 201 and an output voltage of the BBU 202 at the time of power outage is described. Here, cases that the number of CMs $j mounted on the MP 204 is "four" and "two" are exemplified for description.

Figure 12:
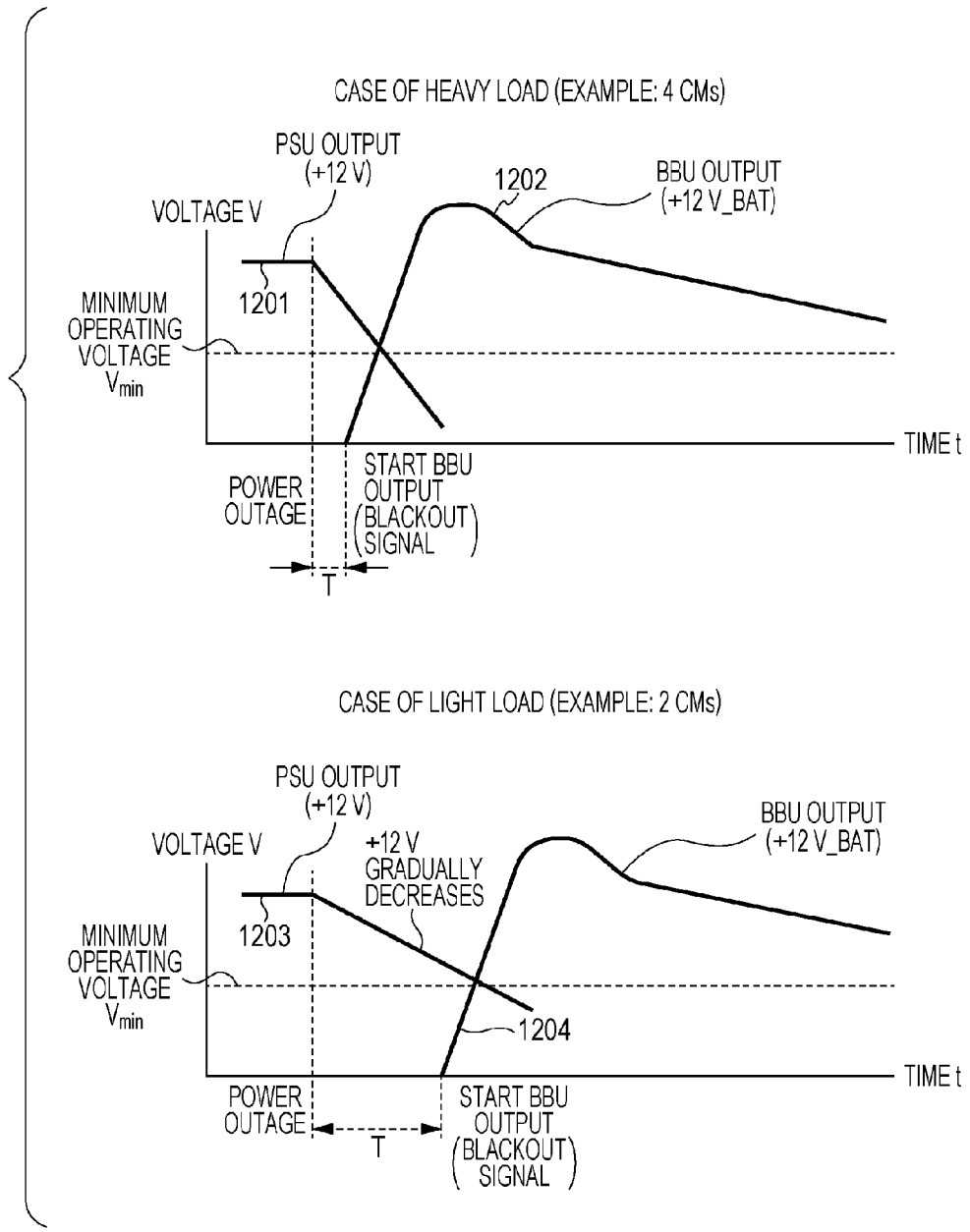
FIG. 12 is an illustration (part 1) depicting relationship between an output voltage of the PSU and an output voltage of a BBU.

FIG. 12 is an illustration (part 1) depicting relationship between an output voltage of the PSU 201 and an output voltage of a BBU 202. In FIG. 12, a graph 1201 represents temporal variation of an output voltage of the PSU 201 at the time of power outage in a case that the number of CMs $j mounted on the MP 204 is four. A graph 1202 represents temporal variation of an output voltage of the BBU 202 at the time of power outage in a case that the number of CMs $j mounted on the MP 204 is four.

A graph 1203 represents temporal variation of an output voltage of the PSU 201 at the time of power outage in a case that the number of CMs $j mounted on the MP 204 is two. A graph 1204 represents temporal variation of an output voltage of the BBU 202 at the time of power outage in a case that the number of CMs $j mounted on the MP 204 is two.

$V_{min}$ indicates a minimum operating voltage of an SVC #i and a CM $j. For example, a voltage that is supplied to the SVC #i is converted by a DC/DC converter of the SVC #i to be supplied to each device in the SVC #i. The minimum operating voltage is a minimum voltage that is supplied to the SVC #i in order to secure a voltage of operating each device in the SVC #i. This is similar for the CM $j as well.

In the example represented by the graphs 1201 and 1202, even when the output timing of a blackout signal is delayed for the set time T, the output voltage of the BBU 202 reaches the minimum operating voltage $V_{min}$ before the output voltage of the PSU 201 at the time of power outage falls below the minimum operating voltage $V_{min}$. Similarly, in the example represented by the graphs 1203 and 1204, even when the output timing of a blackout signal is delayed for the set time T, the output voltage of the BBU 202 reaches the minimum operating voltage $V_{min}$ before the output voltage of the PSU 201 at the time of power outage falls below the minimum operating voltage $V_{min}$.

As just described, by setting the set time T in accordance with a number of CMs $j on the MP 204, that is, the load applied to the PSU 201, it is enabled to secure the minimum operating voltage $V_{min}$ by the output voltage of the BBU 202 before the output voltage of the PSU 201 falls below the minimum operating voltage $V_{min}$.

Next, descriptions are given to relationship between an output voltage of the PSU 201 and an output voltage of the BBU 202 when a connector of the SVC #i is pulled halfway.

Figure 13:
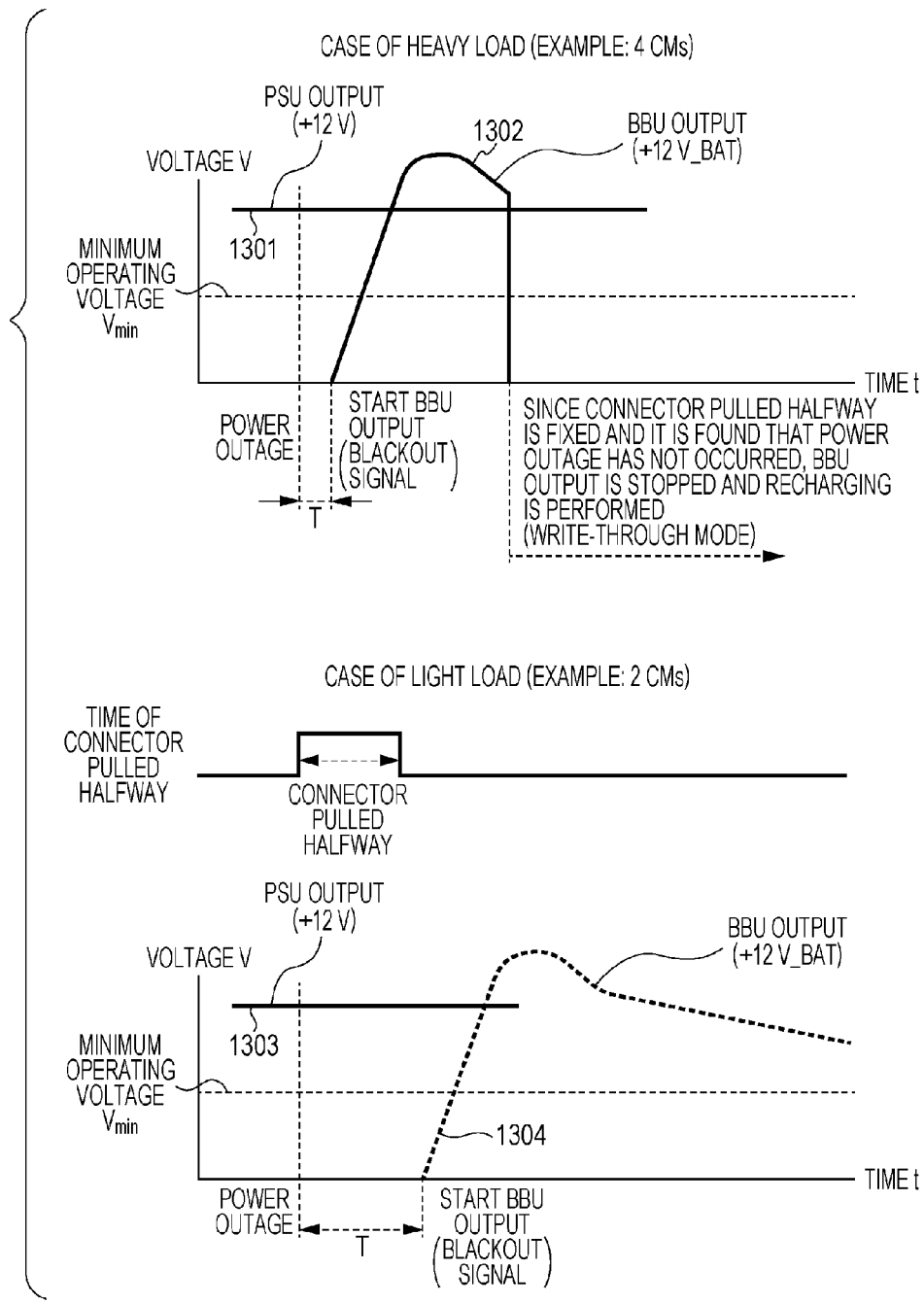
FIG. 13 is an illustration (part 2) depicting relationship between an output voltage of the PSU and an output voltage of a BBU.

FIG. 13 is an illustration (part 2) depicting relationship between an output voltage of the PSU 201 and an output voltage of a BBU 202. In FIG. 13, a graph 1301 represents temporal variation of an output voltage of the PSU 201 when a connector is pulled halfway in a case that the number of CMs $j mounted on the MP 204 is four. A graph 1302 represents temporal variation of an output voltage of the BBU 202 when a connector is pulled halfway in a case that the number of CMs $j mounted on the MP 204 is four.

A graph 1303 represents temporal variation of an output voltage of the PSU 201 when a connector is pulled halfway in a case that the number of CMs $j mounted on the MP 204 is two. A graph 1304 represents temporal variation of an output voltage of the BBU 202 when a connector is pulled halfway in a case that the number of CMs $j mounted on the MP 204 is two.

In the example represented by the graphs 1301 and 1302, as a result of delaying the timing of outputting a blackout signal from an SVC #i for the set time T, the timing of outputting a power supply of +12 V_BAT from the BBU 202 is delayed.

In the example represented by the graphs 1303 and 1304, as a result of delaying the timing of outputting a blackout signal from the SVC #i for the set time T, the BBU 202 is notified of unmount notification of the SVC #i before a power supply of +12 V_BAT is outputted from the BBU 202, so that output of a power supply of +12 V_BAT is not carried out.

As just described, by delaying the timing of outputting a power supply of +12 V_BAT from the BBU 202, it is enabled to suppress the load applied for recharging of the BBU 202. That is, by setting the set time T in accordance with the load applied to the PSU 201, it is possible to secure the minimum operating voltage $V_{min}$ of the SVC #i and the CMs $j at the time of power outage while suppressing the load applied for recharging of the BBU 202 by delaying the timing of outputting a power supply of +12 V_BAT from the BBU 202 as much as possible.

As described above, the SVC #i according to the first embodiment enables to output a blackout signal to the CM $j after a lapse of the set time T in a case of detecting disconnection of electrical connection of the first signal line (for example, the mount signal line 301) to detect a power outage state of the PSU 201. This enables to delay the timing of outputting a blackout signal to CMs $j for the set time T at the time of power outage or pulling a connector halfway.

In addition, according to the SVC #i, it is enabled to output a blackout signal to the BBU 202 after a lapse of the set time T in a case of detecting disconnection of electrical connection of the first signal line (for example, the mount signal line 301) to detect a power outage state of the PSU 201. This enables to delay the timing of outputting a blackout signal to the BBU 202 for the set time T at the time of power outage or pulling a connector halfway.

In addition, according to the SVC #i, it is enabled to notify the CM $j that another SVC #k is not recognized any more in a case of detecting disconnection of electrical connection of the second signal line (for example, the mount signal line 302 or 303) to recognize the SVC #k. This enables to notify the CM $j that the SVC #k is pulled out of the MP 204 and is not recognized any more even in a configuration that a mount signal of the SVC #k is not inputted directly to the CM $j.

In addition, according to the SVC #i, it is enabled to notify the BBU 202 that another SVC #k is not recognized any more in a case of detecting disconnection of electrical connection of the second signal line (for example, the mount signal line 302 or 303) to recognize the SVC #k. This enables to notify the BBU 202 that the SVC #k is pulled out of the MP 204 and is not recognized any more even in a configuration that a mount signal of the SVC #k is not inputted directly to the BBU 202.

In addition, according to the SVC #i, it is enabled to specify the delay time D corresponding to the number of CMs $j mounted on the MP 204 by referring to the BBU output starting time table 500 and to set the specified delay time D as the set time T.

This enables to set the set time T before outputting a blackout signal in accordance with the number of CMs $j on the MP 204. Specifically, in a case that the number of CMs $j on the MP 204 is large and the load of the PSU 201 is high, it is enabled to shorten the set time T as the voltage of the PSU 201 rapidly decreases at the time of power outage compared with a case of a smaller number of CMs $j. In contrast, in a case that the number of CMs $j on the MP 204 is smaller and the load of the PSU 201 is low, it is enabled to lengthen the set time T as the voltage of the PSU 201 gradually decreases at the time of power outage compared with a case of a larger number of CMs $j.

From these points, according to the storage system 200, it is enabled to reduce defects of accepting a blackout signal before the CM $j and the BBU 202 recognize that the SVC #i is removed at the time of pulling a connector halfway. This enables to avoid execution of useless power outage process by the CM $j and the BBU 202 during maintenance, inspection, and the like of the SVC #i.

Specifically, for example, it is enabled to avoid backup process by the CM $j to interrupt the communication with the host device 220 during maintenance, inspection, and the like of the SVC #i, and to suppress a decrease of service quality. In addition, it is enabled to avoid output of a power supply of +12 V_BAT by the BBU 202 during maintenance, inspection, and the like of the SVC #i, and to suppress a decrease of process performance of the storage system 200 as the mode of operation becomes a write-through mode in association with recharging.

(Second Embodiment)

Next, descriptions are given to a storage system 200 according to the second embodiment. In the second embodiment, descriptions are given to a case that a CM $j and the BBU 202 execute power outage process after waiting for the set time T in a case of accepting a blackout signal from the SVC #i. Description of areas identical to the areas described in the first embodiment is omitted.

(Functional Configuration Example of SVC #i)

Figure 14:
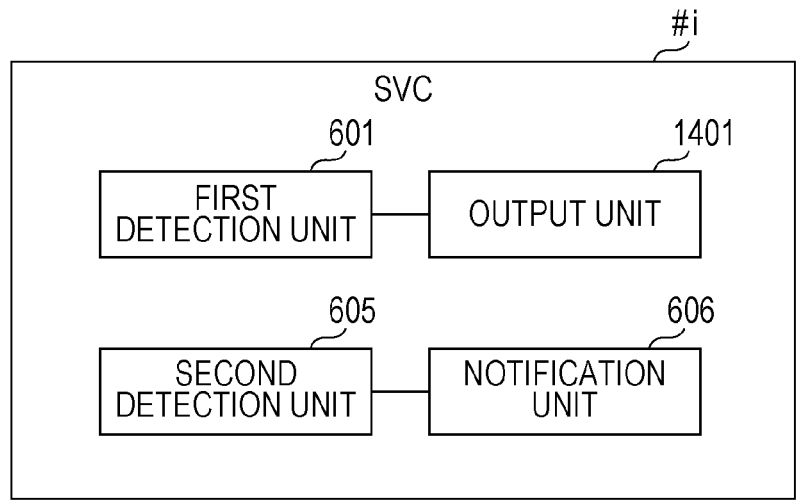
FIG. 14 is a block diagram depicting a functional configuration example of an SVC #i according to a second embodiment.

FIG. 14 is a block diagram depicting a functional configuration example of an SVC #i according to a second embodiment. In FIG. 14, the SVC #i has a configuration that includes a first detection unit 601, a second detection unit 605, a notification unit 606, and an output unit 1401. The respective functional units achieve their functions specifically by, for example, causing the CPU 401 to execute a program that is memorized in the memory 402 of the SVC #i or by the I/F 403. In addition, a process result of each functional unit is memorized in, for example, the memory 402.

Descriptions are given below to the functional unit that is different from the functional units of the SVC #i according to the first embodiment.

The output unit 1401 has a function of outputting a blackout signal to a CM $j in a case that disconnection of electrical connection of the first signal line is detected by the first detection unit 601. This enables to output a blackout signal to the CM $j at the time of power outage or pulling a connector halfway.

In addition, the output unit 1401 may also output a blackout signal to the BBU 202 in a case that disconnection of electrical connection of the first signal line is detected by the first detection unit 601. This enables to output a blackout signal to the BBU 202 at the time of power outage or pulling a connector halfway.

(Functional Configuration Example of CM $j)

Figure 15:
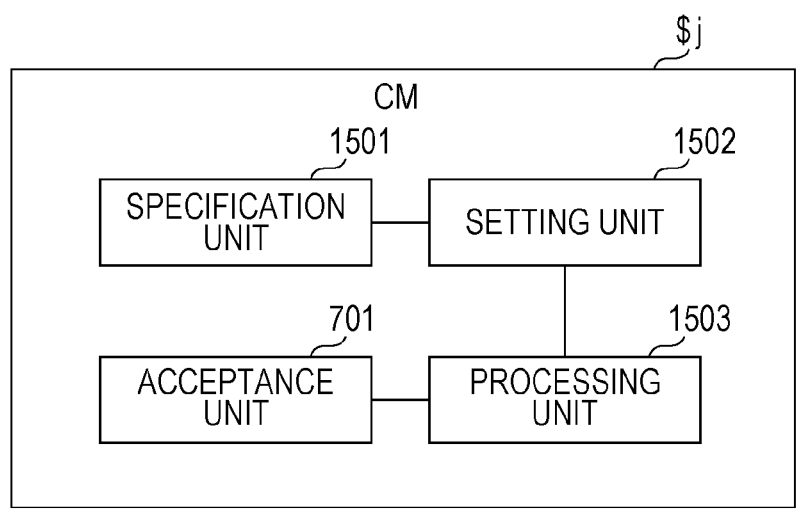
FIG. 15 is a block diagram depicting a functional configuration example of a CM $j according to the second embodiment.

FIG. 15 is a block diagram depicting a functional configuration example of a CM $j according to the second embodiment. In FIG. 15, the CM $j has a configuration that includes an acceptance unit 701, a specification unit 1501, a setting unit 1502, and a processing unit 1503. The respective functional units achieve their functions specifically by, for example, causing the CPU 401 to execute a program that is memorized in the memory 402 of the CM $j or by the I/F 403.

In addition, a process result of each functional unit is memorized in, for example, the memory 402.

Descriptions are given below to the functional units that are different from the functional units of the CM $j according to the first embodiment.

The specification unit 1501 has a function of specifying the delay time D corresponding to the number of CMs $j mounted on the MP 204. Here, the delay time D indicates a latency time from accepting a blackout signal from the SVC #i to execution of power outage process.

Specifically, for example, the specification unit 1501 may also specify a BBU output starting time corresponding to the number of CMs $j on the MP 204 as the delay time D referring to the BBU output starting time table 500 illustrated in FIG. 5.

The setting unit 1502 has a function of setting the delay time D that is specified by the specification unit 1501 as the set time T. This enables to set the set time T before executing power outage process in accordance with the number of CMs $j on the MP 204. Specifically, in a case that the number of CMs $j on the MP 204 is large and the load of the PSU 201 is high, it is enabled to shorten the set time T as the voltage of the PSU 201 rapidly decreases compared with a case of a smaller number of CMs $j. In contrast, in a case that the number of CMs $j on the MP 204 is smaller and the load of the PSU 201 is low, it is enabled to lengthen the set time T as the voltage of the PSU 201 gradually decreases compared with a case of a larger number of CMs $j.

The processing unit 1503 has a function of executing predetermined power outage process after a lapse of the set time T from acceptance of a blackout signal in a case of accepting a blackout signal from the SVC #i. Specifically, for example, in a case of accepting a blackout signal from a recognized SVC #i, the processing unit 1503 cancels exchange of data with host device 220 after a lapse of the set time T and carries out backup of data that is memorized in the cache $j.

To the BBU 202 as well, a functional configuration similar to the CM $j described above may also be applied.

(Power Outage Process Procedure of SVC #i)

Next, descriptions are given to a power outage process procedure of an SVC #i according to the second embodiment. Power outage process of an SVC #i starts execution in a case, for example, that a power supply of the SVC #i is activated, that is, a case that supply of electrical power from the PSU 201 to the SVC #i is started.

Figure 16:
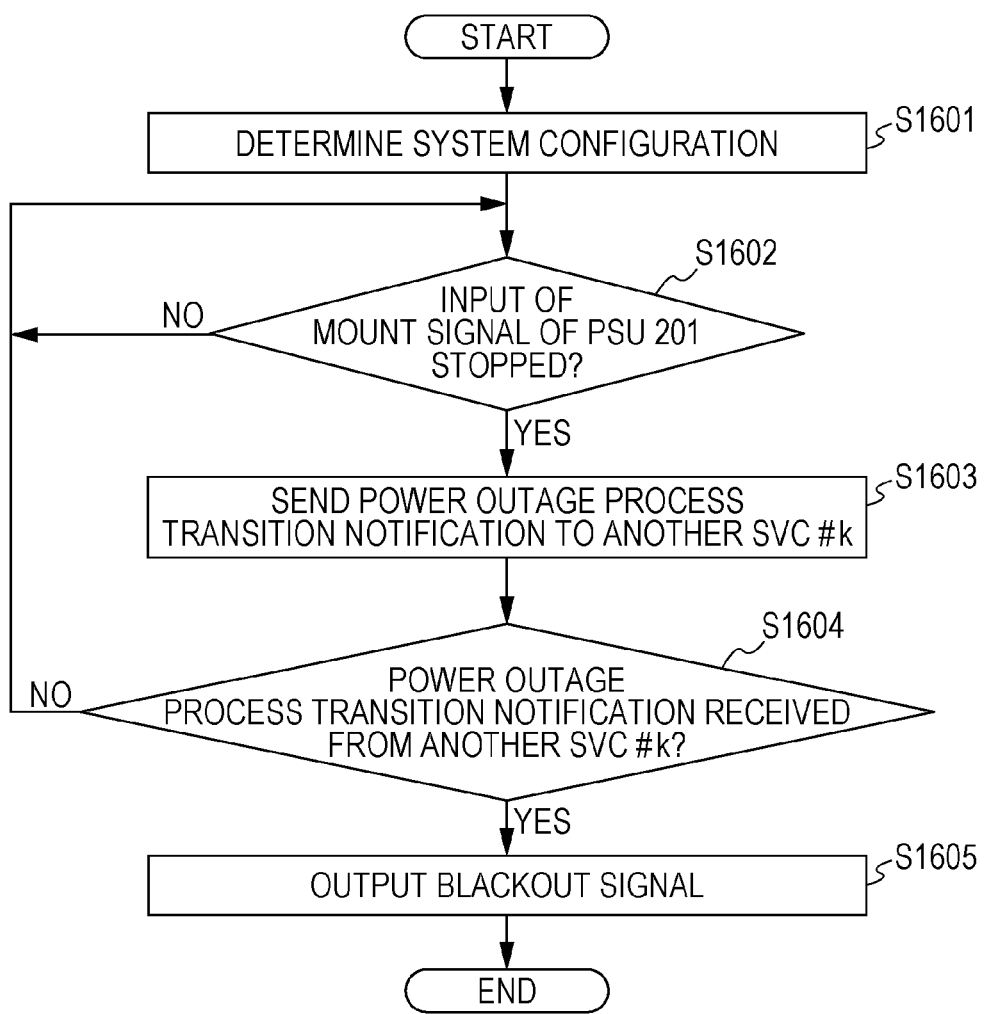
FIG. 16 is a flowchart representing an example of a power outage process procedure of the SVC #i according to the second embodiment.

FIG. 16 is a flowchart representing an example of a power outage process procedure of the SVC #i according to the second embodiment. In the flowchart of FIG. 16, the SVC #i firstly determines a system configuration of the storage system 200 (operation S1601).

Next, the SVC #i determines whether or not input of a mount signal of the PSU 201 is stopped (operation S1602). Here, the SVC #i waits for a stop of the input of a mount signal of the PSU 201 (No in operation S1602). Then, in a case that the input of a mount signal of the PSU 201 is stopped (Yes in operation S1602), the SVC #i sends power outage process transition notification to another SVC #k (operation S1603).

Next, the SVC #i determines whether or not power outage process transition notification is received from the SVC #k (operation S1604). Here, in a case of not receiving power outage process transition notification (No in operation S1604), the SVC #i goes back to operation S1602 to determine whether or not the input of a mount signal of the PSU 201 is stopped.

In contrast, in a case of receiving power outage process transition notification (Yes in operation S1604), the SVC #i outputs a blackout signal to CMs $1 through $m and the BBU 202 (operation S1605) and terminates a series of process by the present flowchart.

This enables to output a blackout signal to CMs $1 through $m and the BBU 202 in a case that the PSU 201 turns into a power outage state. An unmount notification process procedure of the SVC #i according to the second embodiment is similar to the unmount notification process procedure of the SVC #i illustrated in FIG. 10, so that description thereof is omitted.

(Power Outage Process Procedure of CM $j)

Next, descriptions are given to a power outage process procedure of a CM $j according to the second embodiment. Power outage process of a CM $j start execution in a case, for example, that a power supply of the CM $j is activated, that is, a case that supply of electrical power from the PSU 201 to the CM $j is started.

Figure 17:
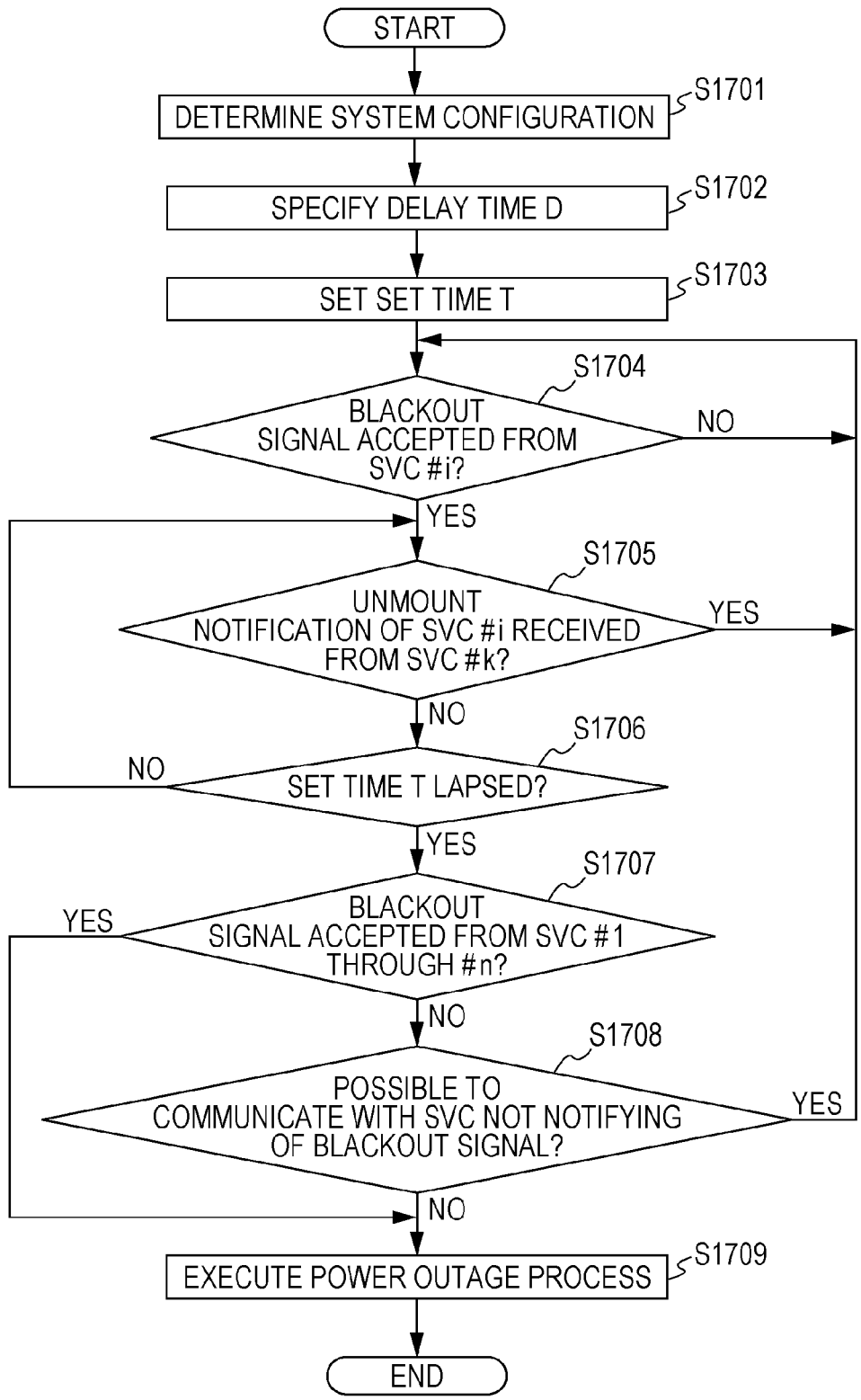
FIG. 17 is a flowchart representing an example of a power outage process procedure of the CM $j according to the second embodiment.

FIG. 17 is a flowchart representing an example of a power outage process procedure of the CM $j according to the second embodiment. In the flowchart of FIG. 17, the CM $j firstly determines a system configuration of the storage system 200 (operation S1701).

Next, the CM $j specifies the delay time D corresponding to the number of CMs $j on the MP 204 referring to the BBU output starting time table 500 (operation S1702). Then, the CM $j sets the specified delay time D as the set time T (operation S1703).

Next, the CM $j determines whether or not a blackout signal is accepted from an SVC #i (operation S1704). Here, the CM $j waits for a blackout signal to be accepted from the SVC #i (No in operation S1704).

Then, in a case of accepting a blackout signal from the SVC #i (Yes in operation S1704), the CM $j determines whether or not unmount notification of the SVC #i is received from another SVC #k (operation S1705). Here, in a case of receiving unmount notification of the SVC #i (Yes in operation S1705), the CM $j goes back to operation S1704.

In contrast, in a case of not receiving unmount notification of the SVC #i (No in operation S1705), the CM $j determines whether or not the set time T is lapsed after accepting a blackout signal from the SVC #i (operation S1706).

Here, in a case that the set time T is not lapsed (No in operation S1706), the CM $j goes back to operation S1705. In contrast, in a case that the set time T is lapsed (Yes in operation S1706), the CM $j determines whether or not a blackout signal is accepted from all of SVCs #1 through #n in the storage system 200 (operation S1707).

Here, in a case of accepting a blackout signal from all of the SVCs #1 through #n (Yes in operation S1707), the CM $j goes on to operation S1709. In contrast, in a case of not accepting a blackout signal from all of the SVCs #1 through #n (No in operation S1707), the CM $j determines whether or not it is possible to communicate with an SVC that has not notified of a blackout signal (operation S1708).

Here, in a case that it is possible to communicate with the SVC that has not notified of a blackout signal (Yes in operation S1708), the CM $j goes back to operation S1704. In contrast, in a case that it is not possible to communicate with the SVC that has not notified of a blackout signal (No in operation S1708), the CM $j executes power outage process (operation S1709) and terminates a series of process by the present flowchart.

This enables to execute power outage process in a case of accepting a blackout signal from all of the SVCs #1 through #n except an SVC that is not capable of communicating due to a failure and the like. A power outage process procedure of the BBU 202 is similar to the power outage process procedure of the CM $j illustrated in FIG. 17, so that illustration and description thereof is omitted.

As described above, the CM $j according to the second embodiment enables to execute predetermined power outage process after a lapse of the set time T in a case of accepting a blackout signal from the SVC #i. This enables to wait for unmount notification of the SVC #i for the set time T before executing predetermined power outage process when a connector of the SVC #i is pulled halfway and to avoid execution of useless power outage process during maintenance, inspection, and the like of the SVC #i.

In addition, the BBU 202 according to the second embodiment enables to execute predetermined power outage process after a lapse of the set time T in a case of accepting a blackout signal from the SVC #i. This enables to wait for unmount notification of the SVC #i for the set time T before executing predetermined power outage process when a connector of the SVC #i is pulled halfway and to avoid execution of useless power outage process during maintenance, inspection, and the like of the SVC #i.

In addition, according to the CM $j and the BBU 202, it is enabled to specify the delay time D corresponding to the number of CMs $j mounted on the MP 204 referring to the BBU output starting time table 500 and to set the specified delay time D as the set time T. This enables to set the set time T before executing power outage process in accordance with the number of CMs $j on the MP 204.

(Third Embodiment)

Next, descriptions are given to a storage system 200 according to the third embodiment. In the third embodiment, a case that a CM $j and the BBU 202 determine whether or not the PSU 201 is in a power outage state from temporal variation of an output voltage of the PSU 201 is described. Areas identical to the areas described in the first and second embodiments are omitted from the descriptions.

(Memory Contents of Voltage Drop Table 1800)

Firstly, descriptions are given to memory contents of a voltage drop table 1800 that is used by a CM $j and the BBU 202. The voltage drop table 1800 is memorized in, for example, the memory 402 of the CM $j and the BBU 202 illustrated in FIG. 4.

FIG. 18 is an illustration depicting an example of memory contents of a voltage drop table 1800. In FIG. 18, the voltage drop table 1800 has fields of a clock time, a voltage, and a voltage drop. By setting information for each field, voltage drop information (for example, voltage drop information 1800-1 through 1800-4) is memorized as a record.

Here, the clock time is a clock time when a voltage that has outputted from the PSU 201 is detected. The voltage is a voltage that is outputted from the PSU 201. The voltage drop is a voltage of the PSU 201 that decreases between the clock time of the previous item and the clock time of the present item.

For example, the voltage drop information 1800-1 indicates a voltage V1 of the PSU 201 that is detected at a clock time t1. Since the clock time t1 is the first item, the voltage drop is "-(null)". For example, the voltage drop information 1800-2 indicates a voltage V2 of the PSU 201 and the voltage drop $\Delta V1$ (=V1−V2) detected at a clock time t2.

(Memory Contents of Decision Table 1900)

Next, descriptions are given to memory contents of a decision table 1900 that is used by the CM $j and the BBU 202. The decision table 1900 is memorized in, for example, the memory 402 of the CM $j and the BBU 202 illustrated in FIG. 4.

FIG. 19 is an illustration depicting an example of memory contents of a decision table 1900. In FIG. 19, the decision table 1900 has fields of a number of mounted modules, $\Delta t$, and $\Delta V_{th}$. By setting information for each field, decision information 1900-1 through 1900-3 is memorized as a record.

Here, the number of mounted modules represents a number of CMs $j that are mounted in the storage system 200. $\Delta t$ is a unit time that represents a time interval to detect a voltage that is outputted from the PSU 201. $\Delta V_{th}$ is a voltage drop threshold of a voltage that is outputted from the PSU 201 per unit time $\Delta t$. For example, the decision information 1900-1 indicates a unit time $\Delta t$ "20 ms" and a voltage drop threshold $\Delta V_{th}$ "1 V" in a case that the number of CMs $j is two.

(Determination Example of Power Outage State of PSU 201)

Next, descriptions are given to a determination example that a CM $j determines a power outage state of the PSU 201.

Figure 20:
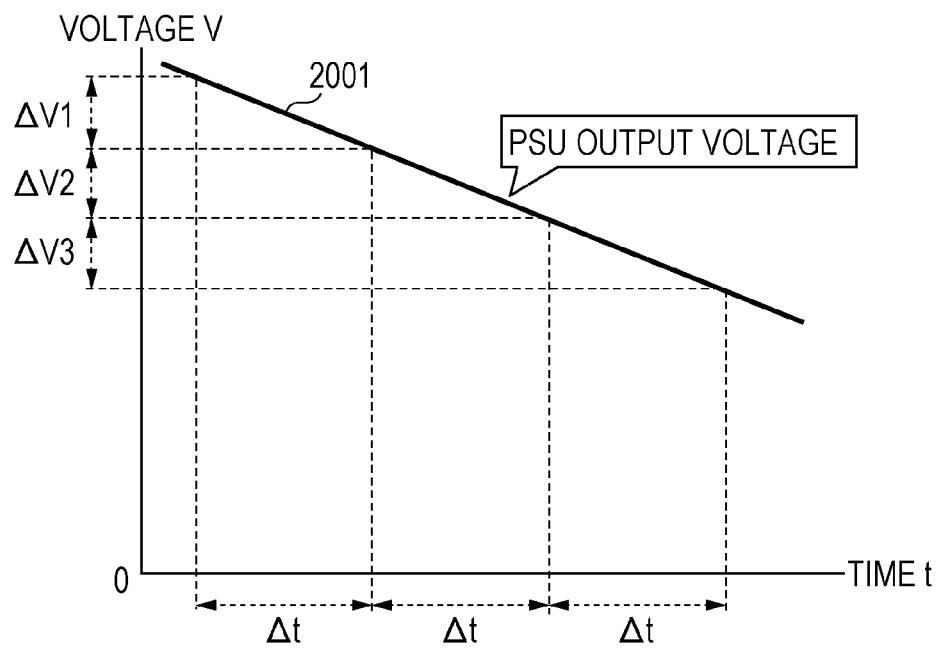
FIG. 20 is an illustration depicting an example of temporal variation of an output voltage of a PSU.

FIG. 20 is an illustration depicting an example of temporal variation of an output voltage of a PSU 201. In FIG. 20, a graph 2001 that indicates temporal variation of an output voltage of the PSU 201 is represented. A CM $j detects, for example, a power supply that is periodically outputted from the PSU 201 and determines a power outage state of the PSU 201 from temporal variation of an output voltage of the PSU 201.

Specifically, for example, the CM $j firstly detects a voltage that is outputted from the PSU 201 for each unit time $\Delta t$. It is possible to specify the unit time $\Delta t$ from, for example, the decision table 1900 illustrated in FIG. 19. The detected voltage is memorized in, for example, the voltage drop table 1800 illustrated in FIG. 18.

Next, the CM $j calculates a voltage drop $\Delta V$ of the PSU 201 that has decreased during the unit time $\Delta t$. The calculated voltage drop $\Delta V$ is memorized in, for example, the voltage drop table 1800. Then, the CM $j determines that the PSU 201 turns into a power outage state in a case that the voltage drop $\Delta V$ per unit time $\Delta t$ becomes continuously the voltage drop threshold $\Delta V_{th}$ or more and the voltage outputted from the PSU 201 becomes a voltage threshold $V_{th}$ from +12 V.

The voltage threshold $V_{th}$ is set in accordance with, for example, a minimum operating voltage of the CM $j and the BBU 202. For example, when the minimum operating voltage of the CM $j and the BBU 202 is "8V", the voltage threshold $V_{th}$ is set approximately at 9 V.

This enables the CM $j to determine that the PSU 201 turns into a power outage state before the voltage outputted from the PSU 201 falls below the minimum operating voltage of the CM $j and the BBU 202 in a case that the voltage outputted from the PSU 201 rapidly decreases.

(Functional Configuration Example of CM $j)

Figure 21:
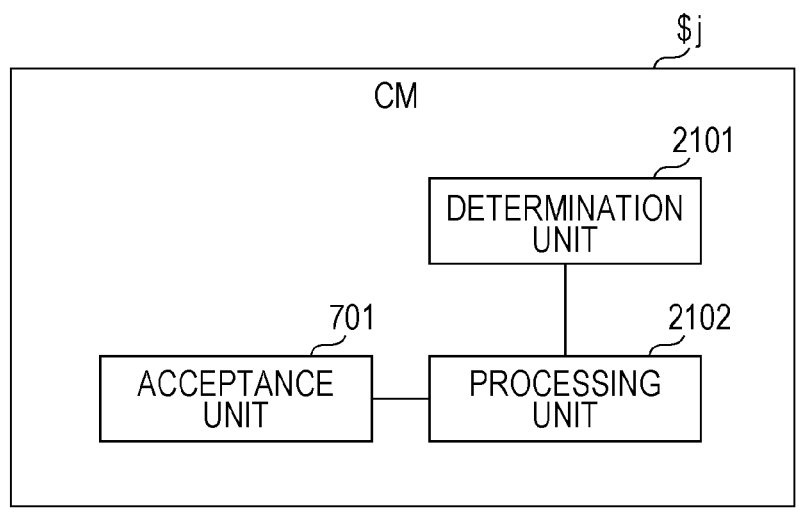
FIG. 21 is a block diagram depicting a functional configuration example of a CM $j according to a third embodiment.

FIG. 21 is a block diagram depicting a functional configuration example of a CM $j according to a third embodiment. In FIG. 21, the CM $j has a configuration that includes an acceptance unit 701, a determination unit 2101, and a processing unit 2102. The respective functional units achieve their functions specifically by, for example, causing the CPU 401 to execute a program that is memorized in the memory 402 of the CM $j or by the I/F 403. In addition, a process result of each functional unit is memorized in, for example, the memory 402.

Descriptions are given below to functional units that are different from the functional units of the CM $j according to the first embodiment.

The determination unit 2101 has a function of determining whether or not the PSU 201 turns into a power outage state based on the temporal variation of the voltage that is outputted from the PSU 201. Specifically, for example, the determination unit 2101 firstly specifies the unit time Δt and the voltage drop threshold $\Delta V_{th}$ corresponding to the number of CMs $j mounted on the MP 204 referring to the decision table 1900 illustrated in FIG. 19.

Then, the determination unit 2101 detects a voltage that is outputted from the PSU 201 for each unit time Δt. It is possible to detect a voltage value of the voltage that is outputted from the PSU 201 by, for example, a function of a DC/DC converter in the CM $j. Next, the determination unit 2101 calculates a voltage drop ΔV of the PSU 201 that has decreased during the unit time Δt. The detected voltage and the calculated voltage drop ΔV are memorized in, for example, the voltage drop table 1800.

Then, the determination unit 2101 determines that the PSU 201 turns into a power outage state in a case that the voltage drop ΔV per unit time Δt becomes continuously the voltage drop threshold $\Delta V_{th}$ or more and the voltage outputted from the PSU 201 becomes a voltage threshold $V_{th}$ from +12 V. The determination unit 2101 may also determine that the PSU 201 comes back from the power outage state in a case that the voltage outputted from the PSU 201 becomes the voltage threshold $V_{th}$ or less and then becomes larger than the voltage threshold $V_{th}$ again.

The processing unit 2102 has a function of executing predetermined power outage process in a case that a blackout signal is accepted from the SVC #i and also the PSU 201 is determined to be in a power outage state by the determination unit 2101. That is, the processing unit 2102 does not execute power outage process, even when accepting a blackout signal from the SVC #i, in a case that the PSU 201 is not determined to be in a power outage state. This enables to avoid that power outage process is executed incorrectly when a connector of the SVC #i is pulled halfway.

In addition, the CM $j may also notify the BBU 202 that the PSU 201 turns into a power outage state in a case of accepting a blackout signal from the SVC #i and also determining the PSU 201 to be in a power outage state. In this case, the BBU 202 may also start execution of power outage process that outputs a power supply of +12 V_BAT in a case of being notified that the PSU 201 turns into power outage state from the CM $j.

To the BBU 202 as well, a functional configuration similar to the CM $j described above may also be applied. A functional configuration of the SVC #i is similar to the SVC #i according to the first or second embodiment, so that illustration and description thereof is omitted here.

(Various Process Procedures of CM $j)

Next, descriptions are given to various process procedures of a CM $j according to the third embodiment. Various types of process of a CM $j start execution in a case, for example, that a power supply of the CM $j is activated, that is, a case that supply of electrical power from the PSU 201 to the CM $j is started. Firstly a determination process procedure of a CM $j according to the third embodiment is described.

FIG. 22 is a flowchart representing an example of a determination process procedure of the CM $j according to the third embodiment. In the flowchart of FIG. 22, the CM $j firstly determines a system configuration of the storage system 200 (operation S2201).

Next, the CM $j specifies the unit time Δt and the voltage drop threshold $\Delta V_{th}$ corresponding to the number of CMs $j mounted on the MP 204 referring to the decision table 1900 (operation S2202). Then, the CM $j determines whether or not the specified unit time Δt is lapsed (operation S2203).

Here, the CM $j waits for a lapse of the unit time Δt (No in operation S2203). Then, in a case that the unit time Δt is lapsed (Yes in operation S2203), the CM $j detects a voltage that is outputted from the PSU 201 (operation S2204). Next, the CM $j calculates the voltage drop ΔV of the PSU 201 that has decreased during the unit time Δt (operation S2205).

Then, the CM $j determines whether or not the PSU 201 turns into a power outage state referring to the voltage drop table 1800 (operation S2206). Here, in a case that the PSU 201 is not in a power outage state (No in operation S2206), the CM $j goes back to operation S2203.

In contrast, in a case that the PSU 201 turns into a power outage state (Yes in operation S2206), the CM $j holds a determination result that determines the PSU 201 to be in a power outage state in the memory 402 (operation S2207) and terminates a series of process by the present flowchart.

This enables to determine whether or not the PSU 201 turns into a power outage state based on temporal variation of the voltages outputted from the PSU 201.

Next, a power outage process procedure of the CM $j according to the third embodiment is described.

FIG. 23 is a flowchart representing an example of a power outage process procedure of the CM $j according to the third embodiment. In the flowchart of FIG. 23, the CM $j firstly determines whether or not a blackout signal is accepted from the SVC #i (operation S2301). Here, the CM $j waits for a blackout signal to be accepted from the SVC #i (No in operation S2301).

Then, in a case that a blackout signal is accepted from the SVC #i (Yes in operation S2301), the CM $j determines whether or not the PSU 201 turns into a power outage state (operation S2302). Specifically, for example, the CM $j determines that the PSU 201 turns into a power outage state in a case that the determination result that determines the PSU 201 to be in a power outage state is held in the memory 402.

Here, in a case that the PSU 201 is not in a power outage state (No in operation S2302), the CM $j goes back to operation S2301. In contrast, in a case that the PSU 201 turns into a power outage state (Yes in operation S2302), the CM $j executes power outage process (operation S2303) and terminates a series of process by the present flowchart.

This enables to execute power outage process in a case that a blackout signal is accepted from the SVC #i and also the PSU 201 is determined to be in a power outage state. A power outage process procedure of the BBU 202 according to the third embodiment is similar to the power outage process procedure of the CM $j described above, so that illustration and description thereof is omitted.

As described above, the CM $j according to the third embodiment enables to determine whether or not the PSU 201 turns into a power outage state based on temporal variation of the voltage outputted from the PSU 201. In addition, according to the CM $j, it is enabled to execute predetermined power outage process in a case that the PSU 201 is determined to be in a power outage state when a blackout signal is accepted from the SVC #i.

This enables to execute power outage process in a case that a blackout signal is accepted from the SVC #i and also it is possible to determine to be in a power outage state from temporal variation of the voltage outputted from the PSU 201 and thus enables to avoid execution of useless power outage process during maintenance, inspection, and the like of the SVC #i.

In addition, the BBU 202 according to the third embodiment enables to determine whether or not the PSU 201 turns into a power outage state based on temporal variation of the voltage outputted from the PSU 201. In addition, according to the BBU 202, it is enabled to execute predetermined power outage process in a case that the PSU 201 is determined to be in a power outage state when a blackout signal is accepted from the SVC #i.

This enables to execute power outage process in a case that a blackout signal is accepted from the SVC #i and also it is possible to determine to be in a power outage state from temporal variation of the voltage outputted from the PSU 201 and thus to avoid execution of useless power outage process during maintenance, inspection, and the like of the SVC #i.

When, for example, the load of the CMs $1 through $m in the storage system 200 increases, the output voltage of the PSU 201 sometimes decreases and there is a case that the CM $j turns out to determine that the PSU 201 is in a power outage state even though there is no power outage actually.

With that, the power outage process procedure of the CM $j according to the third embodiment and the power outage process procedure of the CM $j according to the first embodiment may also be combined. Specifically, for example, in the power outage process procedure of the CM $j illustrated in FIG. 11, after the process of Yes in operation S1104 or No in operation S1105, the CM $j may also determine whether or not the PSU 201 turns into a power outage state. The power outage process procedure of the SVC #i is similar to the power outage process procedure of the SVC #i illustrated in FIG. 9.

The power outage process procedure of the CM $j according to the third embodiment and the power outage process procedure of the CM $j according to the second embodiment may also be combined. Specifically, for example, in the power outage process procedure of the CM $j illustrated in FIG. 17, after the process of Yes in operation S1707 or No in operation S1708, the CM $j may also determine whether or not the PSU 201 turns into a power outage state. The power outage process procedure of the SVC #i is similar to the power outage process procedure of the SVC #i illustrated in FIG. 16.

The control methods described in the embodiments are allowed to be achieved by executing a program prepared in advance in a computer, such as a personal computer and a workstation. The control program is recorded in a computer readable recording medium, such as a hard disk, a flexible disk, a CD-ROM, an MO, and a DVD, and executed by being read out from the recording medium by a computer. In addition, the control program may also be distributed via a network, such as the Internet.

The SVC #i and the CM $j described in the embodiments may also be achieved by an application specific integrated circuit (hereinafter, simply referred to as "an ASIC"), such as a standard cell and a structured ASIC, and a programmable logic device (PLD), such as an FPGA. Specifically, for example, it is possible to manufacture an SVC #i and a CM $j by functionally defining the functional units of the SVC #i and the CM $j described above by an HDL description for logic synthesis of the HDL description to be applied to the ASIC or the PLD.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A control device mounted removably on a substrate, comprising:
    a power outage detection unit that detects disconnection of electrical connection of a signal line that is wired to a power supply device on the substrate and detects a power outage state of the power supply device; and
    an output unit that outputs a power outage signal to a control target device on the substrate that executes predetermined power outage process, when disconnection of the electrical connection of the signal line is detected by the power outage detection unit, after a lapse of a fixed time from detection of disconnection of the electrical connection of the signal line, the fixed time being set based on a length of time associated with a state of pulling a connector of the control device halfway from the substrate and a load applied to the power supply device.

2. The control device according to claim 1, further comprising:
    an insertion and removal detection unit that is wired to another control device on the substrate and detects disconnection of electrical connection of a signal line to recognize the other control device; and
    a notification unit that notifies the control target device that the other control device is not recognized in a case that disconnection of the electrical connection of the signal line is detected by the insertion and removal detection unit.

3. The control device according to claim 1, further comprising:
    a specification unit that specifies a delay time corresponding to a number of the control target device mounted on the substrate referring to a memory unit that memorizes the number of the control target device and a delay time before outputting the power outage signal in association; and
    a setting unit that sets the delay time specified by the specification unit as the fixed time.

4. A control method of executing process by a control device mounted removably on a substrate, the method comprising:
    detecting disconnection of electrical connection of a signal line that is wired to a power supply device on the substrate and detects a power outage state of the power supply device; and
    outputting a power outage signal to a control target device on the substrate that executes predetermined power outage process after a lapse of a fixed time from detection of disconnection of the electrical connection of the signal line in a case of detecting disconnection of the electrical connection of the signal line, the fixed time being set based on a length of time associated with a state of pulling a connector of the control device halfway from the substrate and a load applied to the power supply device.

5. A system comprising:
    a control device that is mounted removably on a substrate;
    a control target device on the substrate that executes predetermined power outage process in a case of accepting a power outage signal from the control device; and
    a power supply device on the substrate that supplies electrical power to the control device and the control target device;
    wherein the control device outputs the power outage signal to the control target device, when electrical connection of a signal line that is wired to the power supply device and detects a power outage state of the power supply device is disconnected, after a lapse of a fixed time from disconnection of the electrical connection of the signal line, the fixed time being set based on a length of time associated with a state of pulling a connector of the control device halfway from the substrate and a load applied to the power supply device.

6. The system according to claim 5, wherein
the control target device determines whether or not the power supply device turns into the power outage state based on temporal variation of a voltage that is outputted from the power supply device and, in a case of accepting the power outage signal from the control device and also determining that the power supply device is in the power outage state, executes the power outage process.

7. The system according to claim 5, wherein the control target device does not execute the power outage process when accepting the power outage signal from the control device and determining that the control device is removed from the substrate.

\* \* \* \* \*